(12) United States Patent
Shino

(10) Patent No.: US 7,456,631 B1
(45) Date of Patent: Nov. 25, 2008

(54) NMR PROBE

(75) Inventor: Hideo Shino, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 11/841,318

(22) Filed: Aug. 20, 2007

(30) Foreign Application Priority Data

Aug. 14, 2007 (JP) ............................. 2007-211271

(51) Int. Cl.
 *G01V 3/00* (2006.01)
 *H01Q 9/04* (2006.01)
 *H01Q 21/00* (2006.01)
(52) U.S. Cl. ........................ 324/322; 343/825; 343/844
(58) Field of Classification Search ......... 324/300–322; 600/410–435; 333/219–235; 343/825–831, 343/844
See application file for complete search history.

(56) References Cited

U.S. PATENT DOCUMENTS

| 6,686,741 | B2 * | 2/2004 | Hasegawa ................... 324/322 |
| 6,794,874 | B2 * | 9/2004 | Hasegawa ................... 324/322 |
| 7,135,866 | B2 * | 11/2006 | Weiss et al. ................. 324/322 |
| 7,187,176 | B2 | 3/2007 | Lim et al. |
| 7,196,522 | B2 * | 3/2007 | Weiss et al. ................. 324/322 |
| 7,403,007 | B1 * | 7/2008 | Lim et al. ................... 324/315 |
| 2002/0171426 | A1 * | 11/2002 | Hasegawa ................... 324/322 |

* cited by examiner

*Primary Examiner*—Dixomara Vargas
(74) *Attorney, Agent, or Firm*—The Webb Law Firm

(57) ABSTRACT

An NMR (nuclear magnetic resonance) probe is offered which produces a magnetic field strength adapted for producing an NMR signal within a sample coil. The probe has a resonant circuit including a sample coil, a first transmission line, and a second transmission line. The resonant circuit is designed taking account of the transmission line length $L_s$ of the coil, the transmission line length $L_a$ of the first line, and the transmission line length $L_b$ of the second line. The coil is placed in a position where the magnetic field strength is maximized. Where the electrical characteristics of the resonant circuit are varied by connection of the coil and transmission lines, the transmission line lengths are corrected according to the variations.

12 Claims, 25 Drawing Sheets

(a)          (b)          (c)

NMR PROBE

BACKGROUND OF THE INVENTION

1. Field of the Invention

The present invention relates to an NMR probe for use in an NMR (nuclear magnetic resonance) spectrometer and, more particularly, to an NMR probe that produces a magnetic field at the resonant frequency, the strength of the field being maximized in the center of the sample coil.

2. Description of the Related Art

An NMR probe of this kind is disclosed in patent reference 1. FIG. 25 is a schematic diagram of the NMR probe shown in patent reference 1. The NMR probe, 100, has a resonant circuit including a sample coil 101 and five impedance elements 102, 103, 104, 105, and 106. Of these 5 elements, the impedance elements 102 and 103 are connected in series and connected with one end of the sample coil 101. Similarly, the impedance elements 104 and 105 which are connected in series are connected with the other end of the sample coil 101. The impedance element 106 is connected in parallel with the sample coil 101. More specifically, the impedance elements 102, 103, 104, and 105 are transmission lines. The impedance element 106 is a capacitor or inductor.

In FIG. 25, the impedance elements 102-106 have variable impedances. The resonant circuit produces multiple resonance at a first radio frequency $f_1$ and a second radio frequency $f_2$, where $f_2 < f_1$. Where the impedance elements 102, 103, 104, and 105 are transmission lines, their lengths are adjusted. Where the resonant circuit resonates at the first radio frequency, the adjustment minimizes the strength of the electric field in the center of the sample coil 101.

According to the above-cited patent reference 1, when the resonant circuit resonates at the two frequencies $f_1$ and $f_2$ simultaneously, the minimal point of the electric field strength at the resonant frequency $f_1$ is produced in the center of the coil 101.

[Patent reference 1] U.S. Pat. No. 7,187,176

The subject to be substantially measured in NMR is the magnetic field emitted from the sample to be investigated, the sample being excited by an RF magnetic field. The detected strength of the magnetic field depends on the field strength produced when the sample is excited. Therefore, if this fact is taken into consideration, it is desired that an intense magnetic field be produced efficiently for the RF waves applied to the sample coil.

However, producing the minimal point of the electric field strength in the center of the sample coil as described in the above-cited patent reference 1 is not equivalent to producing an NMR signal that is strong enough to be detected. The NMR signal is generated by the RF magnetic field produced in the position of the sample within the coil.

This is further described by referring to FIGS. 26 and 27. FIG. 26 shows one example of a resonant circuit for detecting an NMR signal, the resonant circuit being designed to resonate at a first RF frequency $f_1$ and a second RF frequency $f_2$ (where $f_2 < f_1$), i.e., producing multiple resonance.

As shown in FIG. 26, a resonant circuit, 100, has a sample coil 201, two transmission lines 202, 203, three impedance circuits 208, 209, 210, a matching circuit 211 and a connector 212 for the first RF waves, and a matching circuit 213 and a connector 214 for the second RF waves.

Respective one ends of the two transmission lines 202 and 203 are connected with the opposite ends of the sample coil 201. The other ends of the two lines 202 and 203 are connected with the impedance circuits 208 and 209, respectively. The impedance circuit 210 connects the junction 220 between the line 202 and the impedance circuit 208 with the junction 221 between the line 203 and the impedance circuit 209. The connector 212 for the first RF waves is connected with the junction 220 via the matching circuit 211 for the first RF waves. The connector 214 for the second RF waves is connected with the junction 221 via the matching circuit 213 for the first RF waves. The three impedance circuits 208, 209, and 210 maintain the impedances at the two junctions 220 and 221 appropriately.

FIG. 27 shows the results of analysis of the distribution of the electric field and the distribution of the magnetic field produced within the sample coil 201. It is assumed that the shown sample coil 201 is a solenoid coil. FIG. 27 shows a cross section taken axially of the coil. Dotted lines extending from the opposite ends of the sample coil 201 indicate extension lines 215 and 216.

In FIG. 27, the sinusoidal curve 217 indicated by the solid line shows the distribution of the magnetic field strength when the coil is resonating at the frequency $f_1$ (600 MHz). The sinusoidal curve 218 indicated by the dotted line indicates the distribution of the electric field strength when the coil is resonating at the same frequency. As can be seen from these curves, the minimal point E of the electric field strength is not coincident with the maximal point B of the magnetic field strength within the coil 201.

In a solid-state NMR probe circuit, it is advantageous that the sample coil and the axis of the sample are tilted by an angle, known as a magic angle, relative to the axis of the transmission line, and the resulting NMR signal is derived. Therefore, the right and left parts of the sample coil are normally different in mechanical structure. This difference in mechanical structure affects the distributions of the electric and magnetic fields within the sample coil. Consequently, the minimal point of the electric field strength and the maximal point of the magnetic field strength within the sample coil are produced at different locations.

As can be seen from the description provided so far, if the circuit is so designed that the minimal point of the electric field strength is placed at the center of the sample coil, there arises the problem that it is impossible to obtain a uniform and strong magnetic field which is necessary to appropriately extract the NMR signal at the position of the sample.

SUMMARY OF THE INVENTION

Accordingly, it is an object of the present invention to provide an NMR probe that produces a magnetic field strength appropriate for obtaining an NMR signal produced by a sample placed within a sample coil.

A first embodiment of the present invention provides an NMR probe having a resonant circuit resonating with first RF waves, a first connector for entering and extracting the first RF waves, and a first matching circuit connected between the first connector and the resonant circuit. The resonant circuit includes: a sample coil made of a conductor and having a first and a second ends; a first transmission line having a first end connected with the first end of the coil and a second end grounded; and a second transmission line having a first end connected with the second end of the coil and a second end grounded. Let $\lambda$ be the wavelength of the first RF waves applied to the resonant circuit. Let n be a positive integer. The total transmission line length of the conductor forming the sample coil, the first transmission line, and the second transmission line is set to a value at which standing waves given by $\{\lambda + (n-1)\lambda/2\}$ are produced. The sample coil is placed at a position where the strength of a produced magnetic field is maximized.

An NMR probe according to a second embodiment of the present invention has a resonant circuit resonating with first RF waves, a first connector for entering and extracting the first RF waves, and a first matching circuit connected between the first connector and the resonant circuit. The resonant circuit includes: a sample coil made of a conductor and having a first and a second ends; a first transmission line having a first end connected with the first end of the coil and a second end grounded; and a second transmission line having a first end connected with the second end of the coil and a second end electrically opened. Let λ be the wavelength of the first RF waves applied to the resonant circuit. Let n be a positive integer. The total transmission line length of the conductor forming the sample coil, the first transmission line, and the second transmission line is set to value at which standing waves given by (¾)λ+(n−1)λ/2 are produced. The sample coil is placed at a position where the strength of a produced magnetic field is maximized.

An NMR probe according to a third embodiment of the present invention has a resonant circuit resonating with first RF waves, a first connector for entering and extracting the first RF waves, and a first matching circuit connected between the first connector and the resonant circuit. The resonant circuit includes: a sample coil made of a conductor and having a first and a second ends; a first transmission line having a first end connected with the first end of the coil and a second end electrically opened; and a second transmission line having a first end connected with the second end of the coil and a second end electrically opened. Let λ be the wavelength of the first RF waves applied to the resonant circuit. Let n be a positive integer. The total transmission line length of the conductor forming the sample coil, the first transmission line, and the second transmission line is set to a value at which standing waves given by (n/2)λ are produced. The sample coil is placed at a position where the strength of a produced magnetic field is maximized.

An NMR probe according to a fourth embodiment of the present invention has a resonant circuit resonating with first RF waves, a first connector for entering and extracting the first RF waves, and a first matching circuit connected between the first connector and the resonant circuit. The resonant circuit includes: a sample coil made of a conductor and having a first and a second ends; a first transmission line having a first end connected with the first end of the coil; and a second transmission line having a first end connected with the second end of the coil. Second ends of the first and second transmission lines are connected together. Let λ be the wavelength of the first RF waves applied to the resonant circuit. Let n be a positive integer. The total transmission line length of the conductor forming the sample coil, the first transmission line, and the second transmission line is set to a value at which standing waves given by nλ are produced. The sample coil is placed at a position where the strength of a produced magnetic field is maximized.

Other objects and features of the invention will appear in the course of the description thereof, which follows.

DETAILED DESCRIPTION OF THE INVENTION

First Embodiment

A first embodiment of the present invention is described by referring to FIGS. 1-9.

Figure 1:
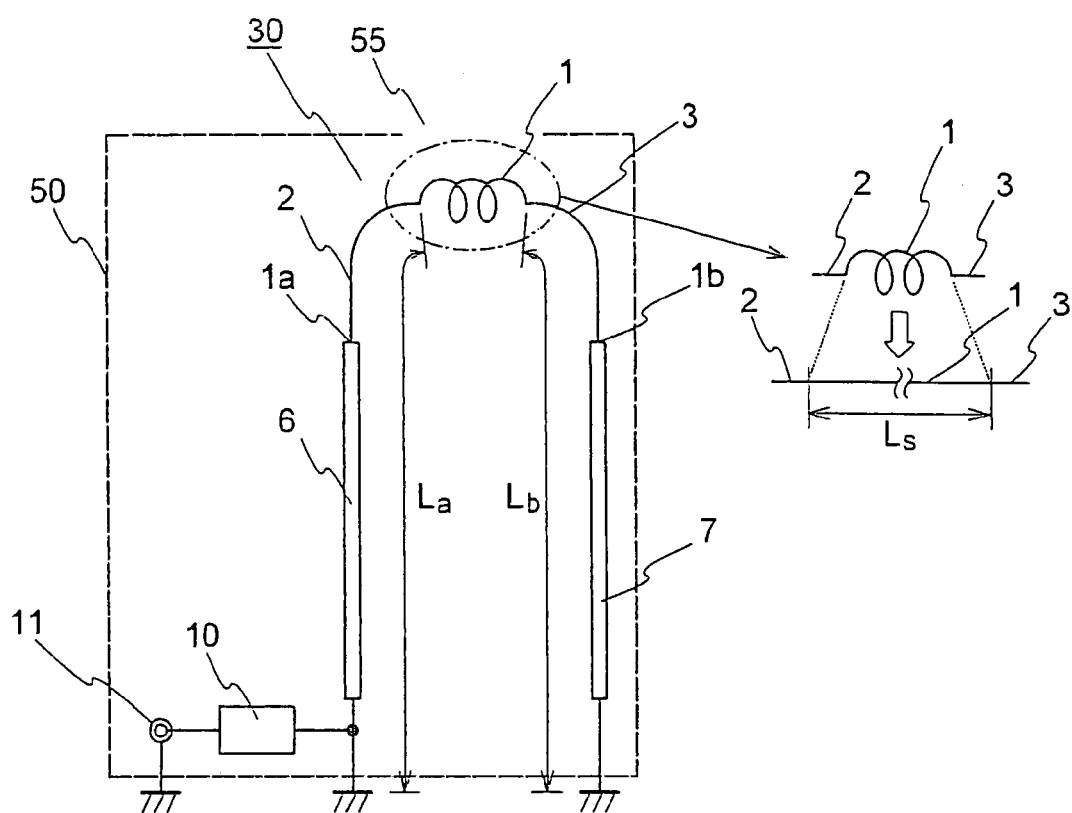
FIG. 1 is a diagram of an NMR probe according to a first embodiment of the present invention.

FIG. 1 is a diagram of an NMR probe according to the first embodiment of the invention. The NMR probe has a resonant circuit 30 resonating with first RF waves having a frequency of $f_1$ and a wavelength of $\lambda$. The resonant circuit 30 has a sample coil 1, a first transmission line 6, and a second transmission line 7. The coil 1 includes extension lines 2 and 3. One end of the first transmission line 6 is connected with a first end 1a of the coil 1. One end of the second transmission line 7 is connected with a second end 1b of the coil 1. The other ends of the first line 6 and second line 7 are grounded. Each of the first and second lines 6 and 7 may include a reactance element (not shown). It is assumed that the frequency $f_1$ of the first waves is the resonant frequency of hydrogen atoms in NMR measurements. Accordingly, in practice, the frequency is of the order of hundreds of MHz.

Figure 23:
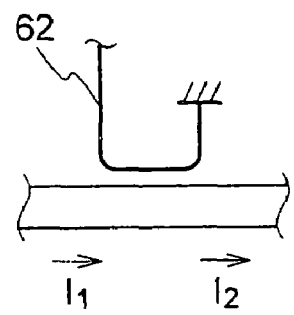
FIG. 23 is a schematic representation illustrating a method of applying or extracting RF waves to or from an NMR probe associated with all embodiments of the invention by the use of magnetic coupling.
Figure 25:
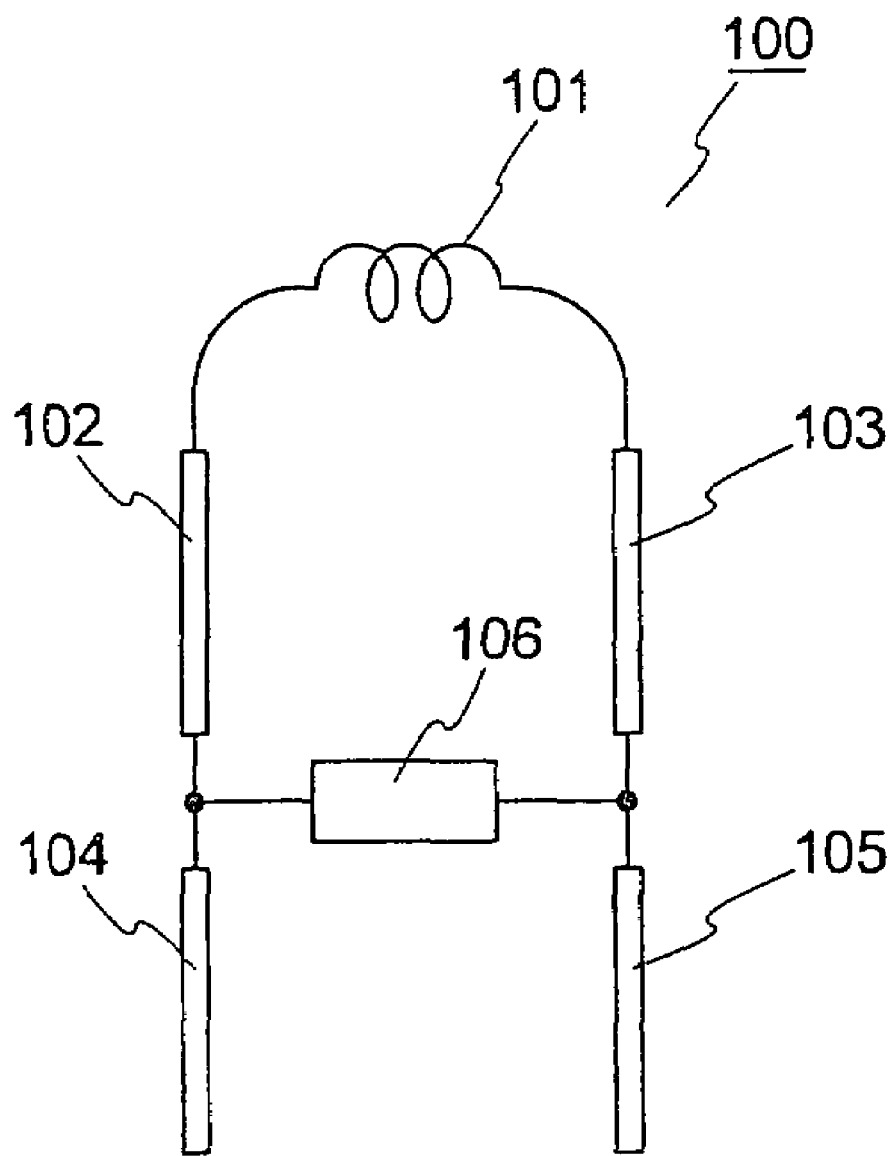
FIG. 25 is a diagram of a related art NMR probe.
Figure 26:
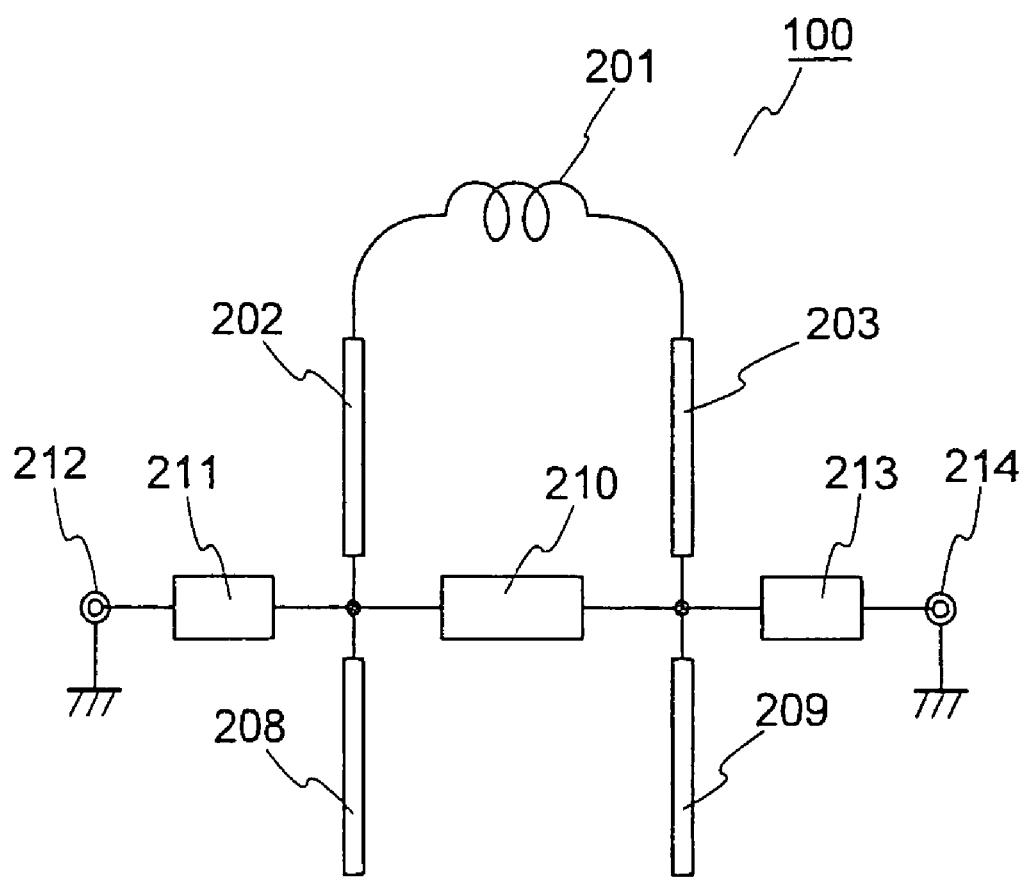
FIG. 26 is a diagram of another related art NMR probe.
Figure 27:
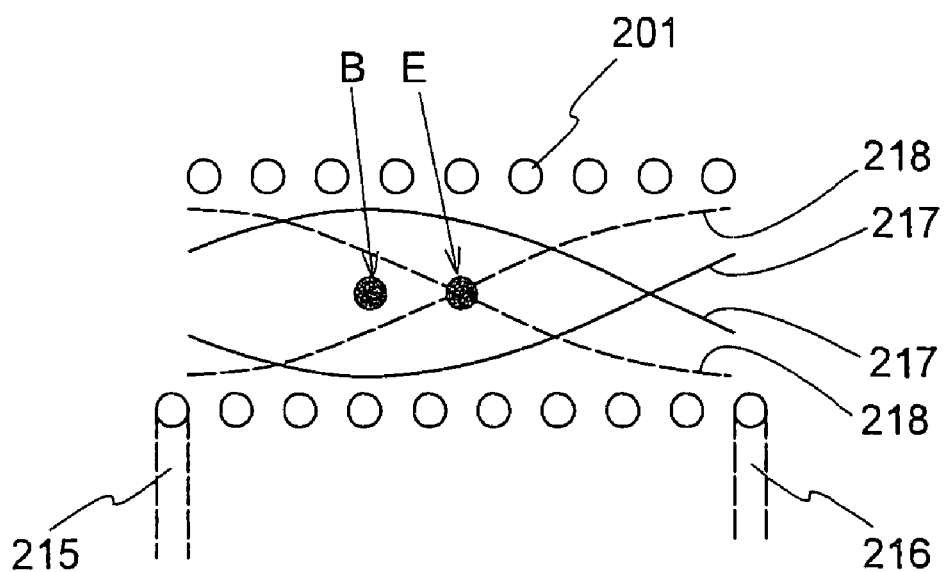
FIG. 27 is a schematic representation illustrating electric and magnetic field distributions produced within the sample coil of the related art NMR probe shown in FIG. 26.

Furthermore, the NMR probe according to the present embodiment has a first connector 11 for entering and extracting the first RF waves and a first matching circuit 10 connected between the first connector and the resonant circuit 30. The resonant circuit 30 and first matching circuit 10 may be directly connected together. Alternatively, they may be magnetically coupled using a magnetic coupling coil 62 as shown in FIG. 23.

The NMR probe can have an electromagnetic shield 50 having an opening 55. In this structure, the first line 6 and second line 7 are not required to be parallel to each other. Instead, they may be arranged along a straight line.

Let $L_s$ be the transmission line length of the conductor of the sample coil 1. Let $L_a$ be the length of the first transmission line 6. Let $L_b$ be the length of the second transmission line 7. The sum of these transmission line lengths is denoted by $L_n$. The length of the extension line 2 is included in the length $L_a$ of the first line 6. The length of the extension line 3 is included in the length $L_b$ of the second line 7.

In order to resonate the resonant circuit 30 at the frequency $f_1$ of the first waves, the total transmission line length $L_n$ is set to a value at which Eq. (1) is satisfied.

$$L_n = \lambda + (n-1) \times \lambda/2 \ (n=1, 2, 3, \ldots) \quad (1)$$

where n is a positive integer.

Where the sample coil 1 is a solenoid coil, the transmission line length $L_s$ of the coil 1 is a length taken along the contour of the coil in three dimensions in calculating the transmission line length $L_s$ of the coil 1. Where the width of the transmission line cannot be neglected compared with the transmission line length of the solenoid coil, or where the transmission line branches into plural routes, the transmission line length $L_s$ of the coil 1 is the shortest path length taken along the surface of the conductor forming the transmission line.

The resonant circuit 30 operated under the condition where n is set to 1 (n=1) in Eq. (1) is shown at the upper stage of FIG. 2(a). The diagram at the upper stage of FIG. 2(a) is obtained by expanding the resonant circuit 30 shown in FIG. 1 along a straight line. The first matching circuit 10 and first connector 11 are omitted. In this resonant circuit 30, the transmission line length $L_s$ is set to $\lambda/4$. The sum of the transmission line length $L_a$ and the transmission line length $L_b$ is set to $\frac{3}{8}\lambda$. The transmission line length $L_s$ is set to $\lambda/4$ but the length is not limited to this value.

The lower stage of FIG. 2(a) shows the magnetic field distribution and electric field distribution in the resonant circuit 30 under the condition where n=1 when the first RF waves having the frequency $f_1$ are applied. In this figure, the distribution of the magnetic field strength is indicated by the solid line. The distribution of the electric field strength is indicated by the broken line. The maximal point of the magnetic field strength is indicated by B. As can be seen from the shown distribution of the electric field strength, if one end of the sample coil 1 is at a positive (+) potential, the other end of the coil is at a negative (−) potential.

As described previously, standing waves having the RF frequency $f_1$ are produced in the resonant circuit 30. At this time, a maximal point of the magnetic field strength appears in the resonant circuit 30 steadily. Therefore, to obtain appropriate magnetic field in the sample coil 1, the center of the coil 1 may be placed at the maximal point of the magnetic field strength.

Figure 2:
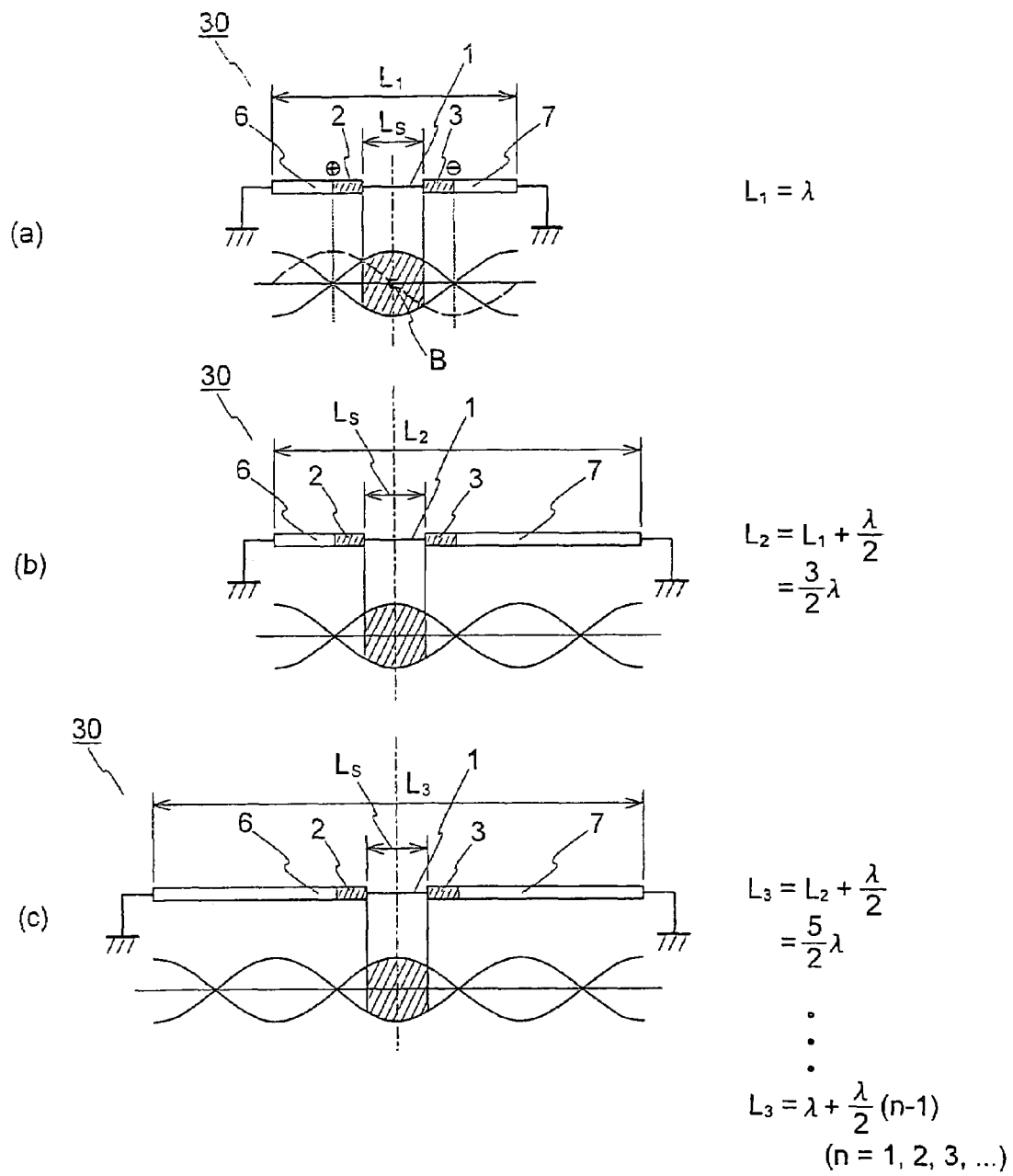
FIG. 2 illustrates the principle of operation of the NMR probe shown in FIG. 1.

If the total transmission line length $L_n$ is determined, the point at which the magnetic field strength is maximized can be easily identified. For example, where n=1, the total transmission line length $L_1$ becomes equal to $\lambda$. Therefore, the magnetic field strength is maximized at a point spaced from the grounded point by a distance of $(\frac{1}{2})\lambda$. If the integer n is two or more, the magnetic field strength has plural maximal points in the resonant circuit 30 as shown in FIG. 2, (b) and (c). Accordingly, the number of locations where the sample coil 1 can be placed is increased.

According to the magnetic field distribution shown in FIG. 2(a), it can be seen that if the transmission line length $L_s$ of the sample coil 1 is set equal to or less than $\lambda/4$, variations in the magnetic field strength in the sample coil decrease. Therefore, the magnetic field strength in the sample coil 1 can be brought closer to a uniform distribution by adjusting the transmission line length $L_s$ of the coil 1.

FIG. 2, (b) and (c), shows the configuration of the resonant circuit 30 satisfying Eq. (1) and the distribution of magnetic field strength in cases where n=2 and n=3, respectively. As described previously, the number of maximal points of the magnetic field strength in the resonant circuit 30 increases in proportion to the integer n.

In order that the maximal point of the magnetic field strength in the resonant circuit 30 satisfying Eq. (1) be placed in the center of the sample coil 1, the total transmission line length $L_n$ is first determined. The position on the circuit at which the magnetic field strength maximizes, i.e., the center position of the coil 1, is determined. Then, the transmission line length $L_s$ of the coil 1 of the circuit is determined. Thereafter, the transmission line length of the first line 6 and the transmission line length of the second line 7 are calculated so as to satisfy Eq. (1). Both lines 6 and 7 are connected with the opposite ends of the sample coil 1.

If the resonant circuit 30 is designed in this way, an appropriate intense magnetic field can be produced in the sample coil 1 in NMR measurements, and the magnetic field emanating from the sample can be detected with high sensitivity.

Modifications of the present embodiment are hereinafter described.

The description of the resonant circuit 30 described above is based on the assumption that the sample coil 1, first transmission line 6, second transmission line 7, and ground are directly connected. Coupling circuits or impedance circuits via which those components are connected may also be provided.

Figure 3:
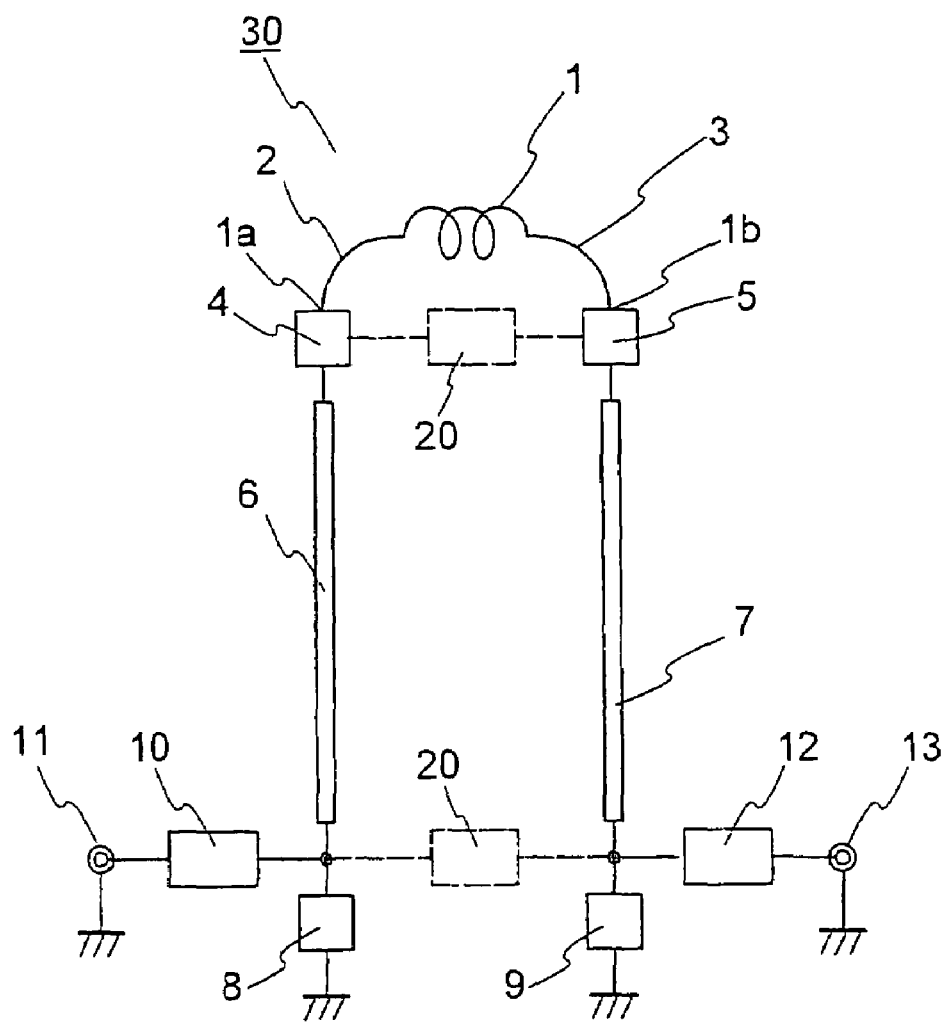
FIG. 3 is a diagram similar to FIG. 1, but in which coupling circuits, impedance circuits, and a matching circuit are added.

FIG. 3 is a diagram of the present embodiment, and in which coupling circuits and impedance circuits are added. As shown in FIG. 3, a first coupling circuit 4 is connected between the first end 1a of the sample coil 1 and the first transmission line 6 to couple them. A second coupling circuit 5 is connected between the second end 1b of the coil 1 and the second transmission line 7 to couple them. The first line 6 is grounded via a first impedance circuit 8. The second line 7 is grounded via a second impedance circuit 9.

Each of the first and second coupling circuits 4 and 5, respectively, includes a variable impedance element for tuning the resonant circuit 30 to the first RF frequency $f_1$, second RF frequency $f_2$, or third RF frequency $f_3$. $F_2$ and $F_3$ will be described later. Furthermore, each of the coupling circuits 4 and 5 includes a connector for connection of the sample coil 1.

The two impedance circuits 8 and 9 show low impedances for the first, second, and third RF waves having the frequencies of $f_1$, $f_2$, and $f_3$, respectively. Therefore, the configuration is substantially equivalent to a circuit in which the first transmission line 6 and the second transmission line 7 are directly grounded. The first and second coupling circuits 4 and 5 may all be added. Alternatively, any one of them may be added.

Where the coupling circuits 4, 5 and the impedance circuits 8, 9 are added to the resonant circuit 30, the speeds of electrical signals passing through the resonant circuit are varied by the electrical characteristics of the circuits 4, 5, 8, and 9, such as their time delay elements or their impedances. In this structure, the transmission line lengths $L_s$, $L_a$, and $L_b$ are corrected appropriately according to the rate of variation of wavelength varying according to the above-described variations. The total transmission line length $L_n$ is made to comply with Eq. (1). Because the resonant circuit 30 has the total transmission line length $L_n$ complying with Eq. (1), the resonant circuit resonates at the first RF frequency $f_1$. Accordingly, an intense magnetic field is set up in the sample coil 1 in NMR measurements. The magnetic field produced from the sample can be detected with good sensitivity.

Furthermore, in the NMR probe according to the present embodiment, at least one third impedance circuit 20 may be added between the first transmission line 6 and the second transmission line 7 to couple them. The impedance circuit 20 indicated by the broken line in FIG. 3 includes impedance elements for tuning the resonant circuit 30 to the first RF frequency $f_1$, second RF frequency $f_2$, or third RF frequency $f_3$. The frequencies $f_2$ and $f_3$ will be described later. Also, in this case, the transmission line lengths $L_s$, $L_a$, and $L_b$ are appropriately corrected taking account of the electrical characteristics such as time delay elements and impedances of the impedance circuit 20. The total transmission line length $L_n$ is made to comply with Eq. (1).

The NMR probe according to the present embodiment can be resonated with plural RF waves. Referring to FIG. 3, a connector 13 from which the second RF waves having the frequency $f_2$ are applied is shown. A second matching circuit 12 is connected between the connector 13 and the resonant circuit 30. The frequency of the second RF waves used in general NMR measurements is a fraction of the first frequency $f_1$ and does not affect the configuration of the resonant circuit 30 complying with Eq. (1). Therefore, it is possible to apply the second RF waves to the resonant circuit 30 when it is resonating with the first RF waves. The first and second RF waves can be superimposed. In FIG. 3, the first matching circuit 10 is connected with the junction between the first transmission line 6 and the impedance circuit 8. Similarly, the second matching circuit 12 is connected with the junction between the second transmission line 7 and the impedance circuit 9. The matching circuits 10 and 12 can be connected at other locations. For example, the first matching circuit 10 may be connected with the first transmission line 6, second transmission line 7, impedance circuit 8, or impedance circuit 9. The second matching circuit may be similarly connected.

Figure 4:
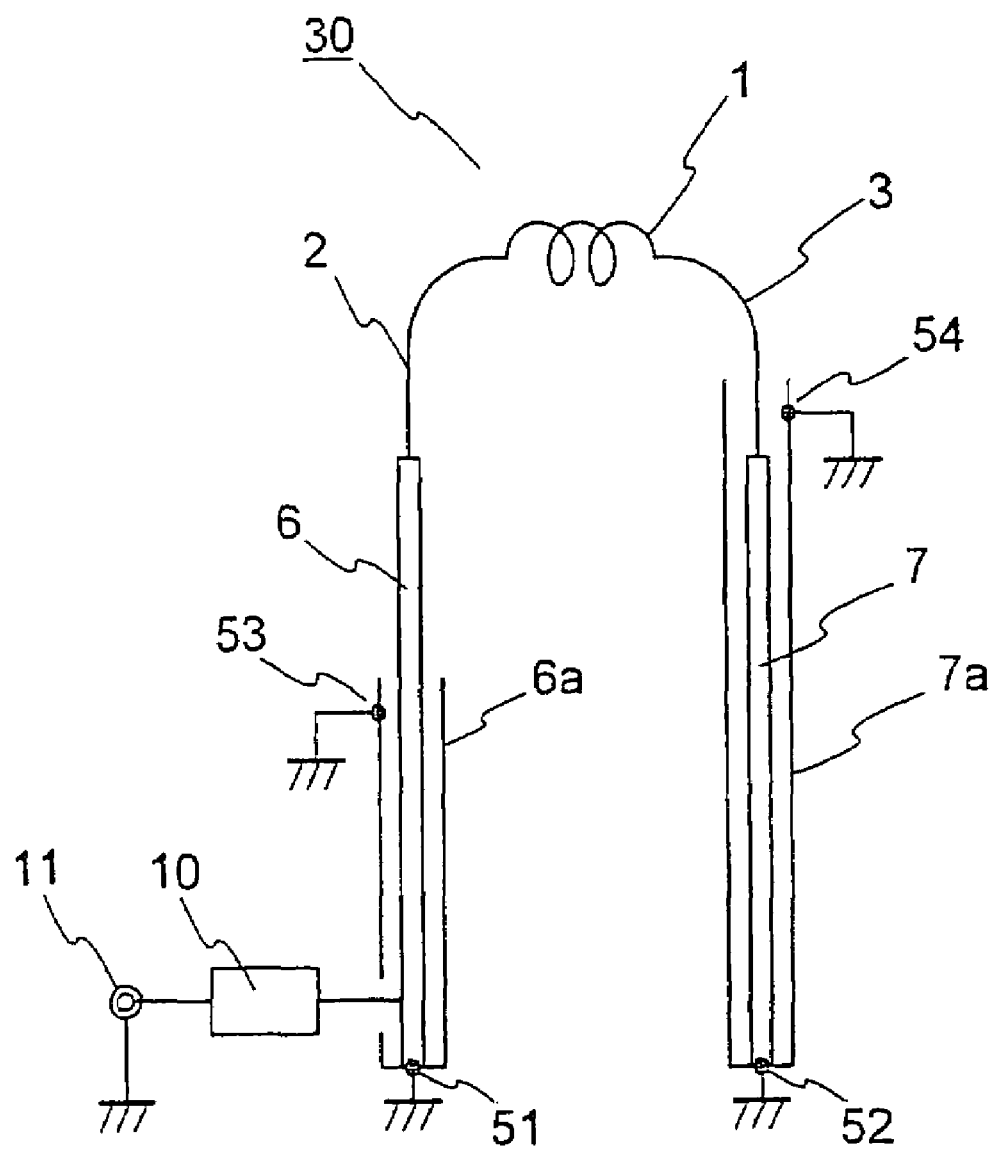
FIG. 4 is a diagram similar to FIG. 1, but in which coaxial cables are added.
Figure 7:
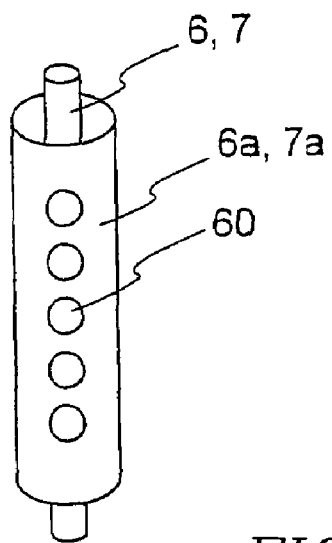
FIG. 7 is a diagram of an NMR probe associated with all embodiments of the present invention, showing a modified example of the geometry of the coaxial cable used in the probe.
Figure 8:
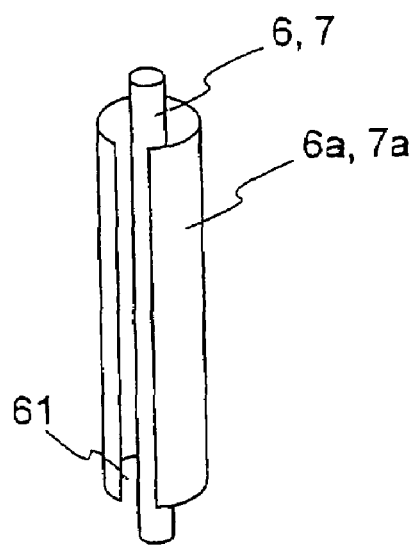
FIG. 8 is a diagram of an NMR probe associated with all embodiments of the present invention, showing another modified example of the geometry of the coaxial cable used in the probe.

In the NMR probe according to the present embodiment, each of the first transmission line 6 and second transmission line 7 may be made of a coaxial cable having an outer conductor layer. FIG. 4 is a diagram of the NMR probe in which each of the transmission lines 6 and 7 is made of a coaxial cable. The inner conductors of the coaxial cables correspond to the first transmission line 6 and the second transmission line 7, respectively. The outer conductor layer 6a of one coaxial cable is grounded at its both ends 51 and 53. Similarly, the outer conductor layer 7a of the other coaxial cable is grounded at its both ends 52 and 54. The transmission line lengths $L_a$ and $L_b$ of the first line 6 and second line 7 are corrected taking account of the electrical characteristics such as the impedance produced between the outer conductor layer and inner conductor. The resonant circuit 30 resonating at the first RF frequency $f_1$ is designed by applying Eq. (1) to the corrected transmission line lengths $L_a$ and $L_b$.

Where RF waves are applied from one of the two coaxial cables 6 and 7 connected with the coil as shown in FIG. 4, the outer conductor layers 6a and 7a of the coaxial cables hinder the coupling between the transmission lines 6 and 7. It is difficult to enhance the efficiency of the resonant circuit 30. Each of the outer conductor layers 6a and 7a usually assumes a seamless geometry. However, to avoid the aforementioned problem, the outer conductor layers 6a and 7a may have holes or a slit. Examples of the structure of these outer conductor layers are shown in FIGS. 7 and 8.

Where the transmission line lengths $L_a$ and $L_b$ of the first transmission line 6 and second transmission line 7 are corrected taking account of variations of the electrical characteristics produced between the first line 6 and second line 7 in this way, the resonant circuit 30 can be designed to resonate at the first RF frequency $f_1$.

Figure 5:
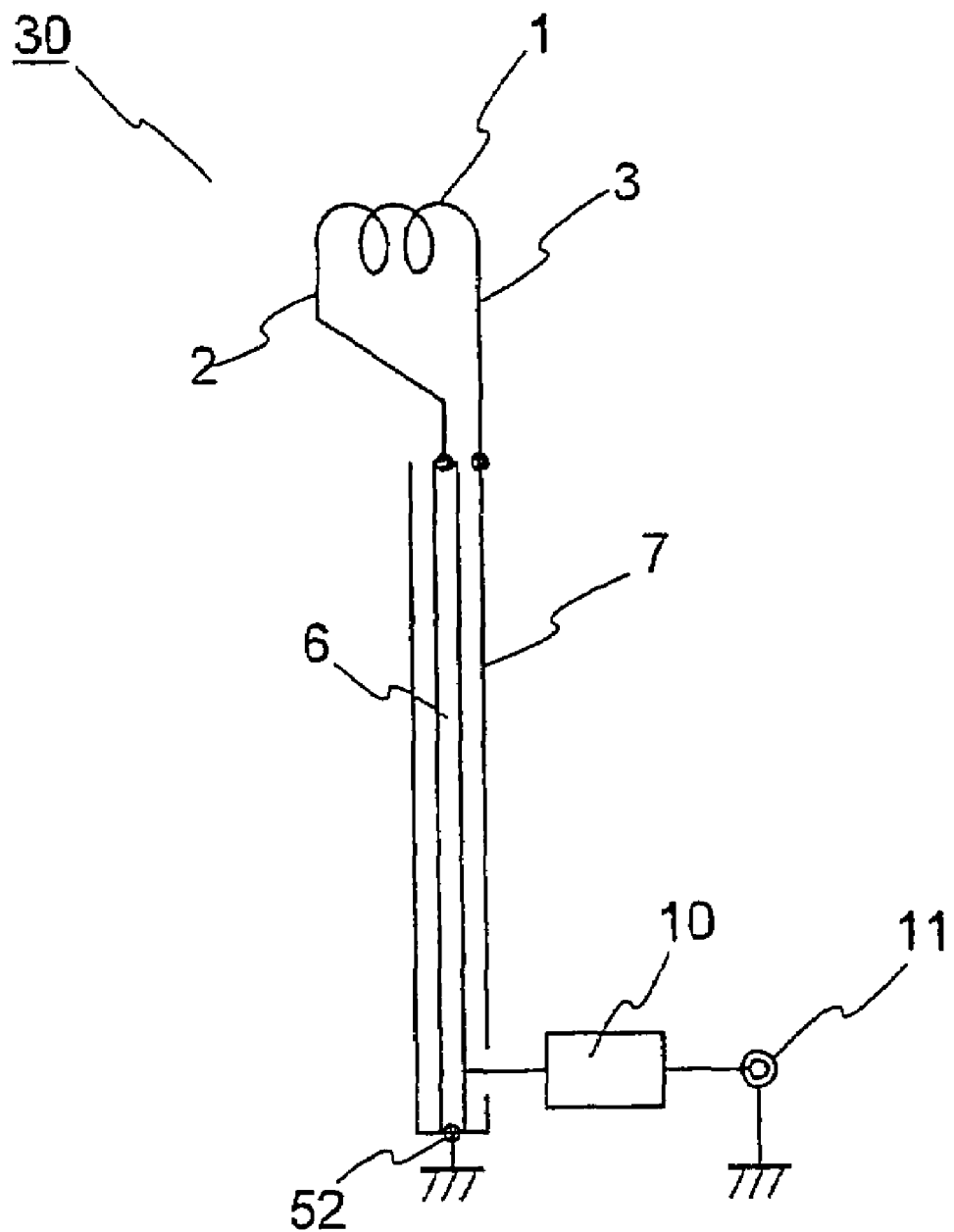
FIG. 5 is a diagram of an NMR probe according to the first embodiment of the invention, and in which a coaxial cable is used.

An example using a coaxial cable is shown in FIG. 5, where the first transmission line 6 forms the inner conductor of the coaxial cable, while the second transmission line 7 forms the outer conductor layer of the cable. One end of the first line 6 and one end of the second line 7 are grounded at an end 52 of the coaxial cable. In the same way as in the above examples, the transmission line lengths $L_a$ and $L_b$ of the first line 6 and second line 7, respectively, are corrected taking account of variations in electrical characteristics produced between the outer conductor layer and the inner conductor. The resonant circuit 30 is designed by applying Eq. (1) to the corrected transmission line lengths $L_a$ and $L_b$ such that the resonant circuit 30 resonates at the first RF frequency $f_1$.

Figure 6:
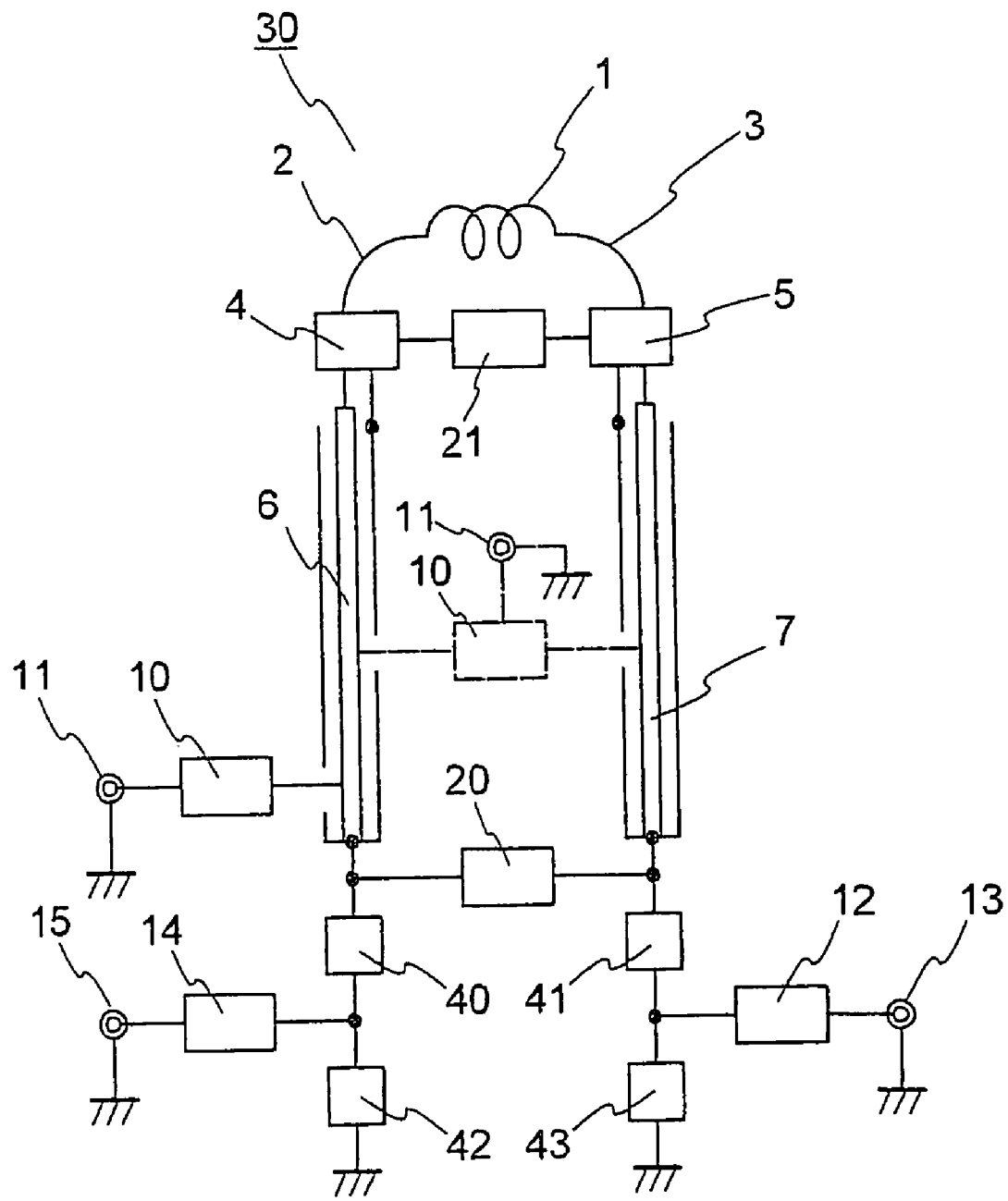
FIG. 6 is a diagram of an NMR probe according to the first embodiment of the invention, and in which plural RF waves are made to induce multiple resonance.

Plural RF waves can be applied where a coaxial cable or cables are used. FIG. 6 shows the resonant circuit according to the present embodiment, and in which third RF waves having frequency $f_3$ can be applied in addition to the first and second RF waves having frequencies $f_1$ and $f_2$, respectively.

In this example, the first transmission line 6 is a coaxial cable having the outer conductor layer 6a. The second transmission line 7 is a coaxial cable having the outer conductor layer 7a. There are further provided a connector 15 from which the third RF waves having the frequency $f_3$ are applied, a third matching circuit 15 for entering the third RF waves into the resonant circuit 30, a fourth impedance circuit 40 connected with the first line 6, a fifth impedance circuit 41 connected with the second line 7, a sixth impedance circuit 42 connecting the impedance circuit 16 and ground, a seventh impedance circuit 43 connecting the impedance circuit 17 and ground, a connector 15 from which the third RF waves having the frequency $f_3$ are applied, and a third matching circuit 14 for entering the third RF waves into the resonant circuit 30.

The two impedance circuits 40 and 41 prevent intrusion of the first RF waves into the second and third matching circuits 12 and 14. When the second and third RF waves having the frequencies $f_2$ and $f_3$, respectively, are applied to the resonant circuit, the first and second coupling circuits 4 and 5 permit the waves to pass through the outer conductor layers 6a and 7a.

The first matching circuit may have an impedance that suppresses intrusion of the second and third RF waves having the frequencies $f_2$ and $f_3$ into the first connector 11.

Also, in the circuit configuration shown in FIG. 6, the transmission line lengths $L_a$ and $L_b$ of the first line 6 and second line 7, respectively, are corrected taking account of variations in electrical characteristics produced between the first line 6 and second line 7. The resonant circuit 30 can be designed to resonate at the first RF frequency $f_1$ by applying Eq. (1).

As indicated by the broken line in FIG. 6, RF waves may be supplied not only to the line 6 but also to the line 7 from the first connector 11 via the matching circuit 10. In this structure, the applied RF waves are so supplied that a phase difference of about 180° is produced between the lines 6 and 7.

Figure 9:
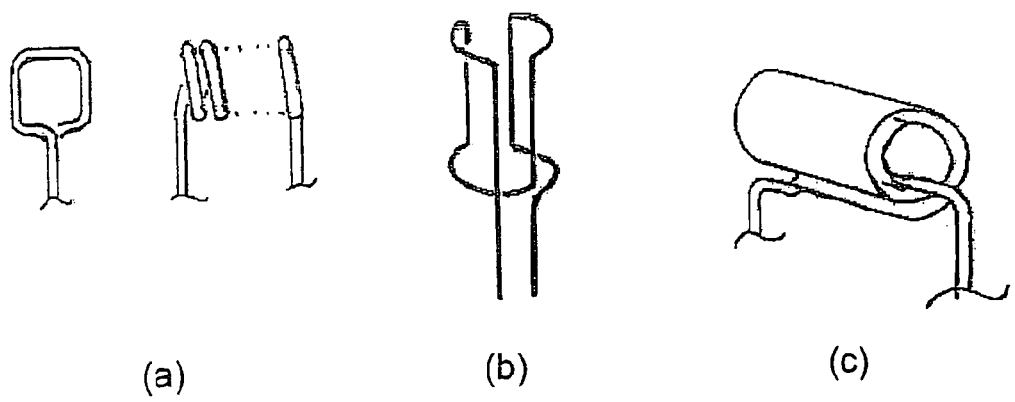
FIG. 9 shows a sample coil for use in an NMR probe associated with all embodiments of the invention.

In the examples described so far, no restrictions are imposed on the whole shape of the sample coil 1 or on the geometry or material of the conductors as long as the transmission line length $L_s$ can be found. The shape of the winding of the sample coil 1 can be circular or elliptical. Besides, as shown in FIG. 9, (a)-(c), the cross section of the coil may be polygonal such as square. Moreover, a saddle-shaped coil, Helmholtz coil, or scroll coil may also be used.

Second Embodiment

A second embodiment of the present invention is next described by referring to FIGS. 10-14.

Figure 10:
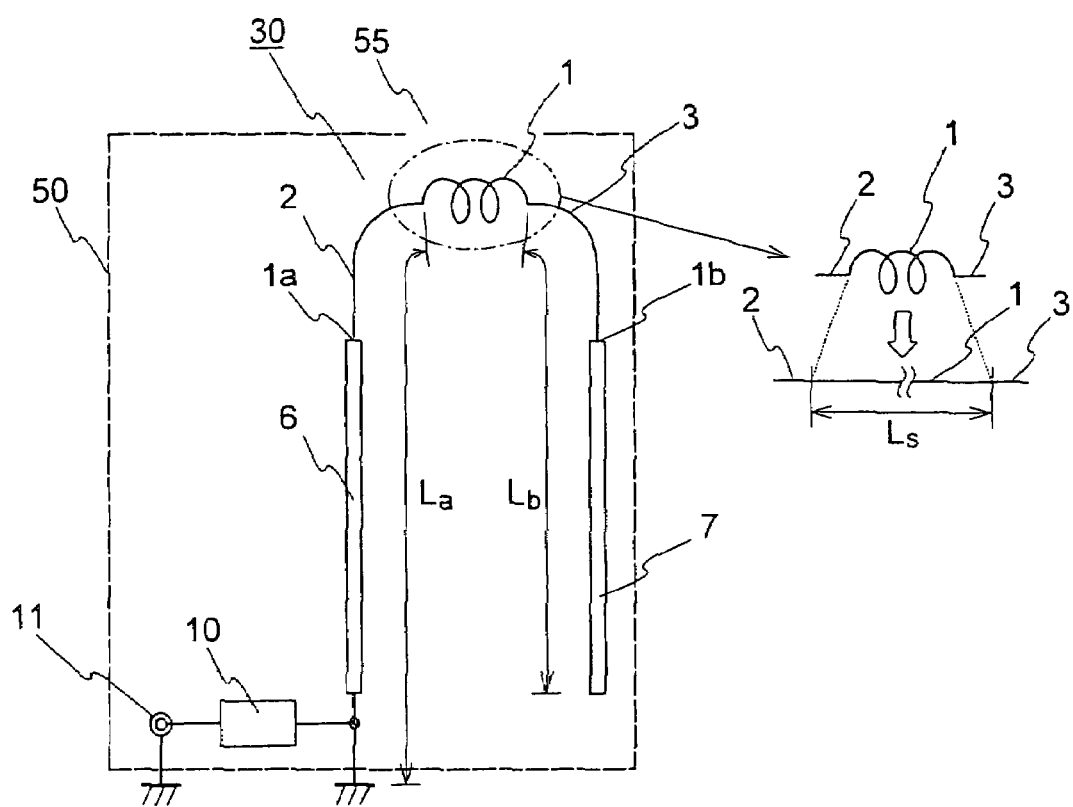
FIG. 10 is a diagram of an NMR probe according to a second embodiment of the invention.

FIG. 10 is a diagram of an NMR probe according to the second embodiment of the invention. As shown in the figure, the NMR probe according to the present embodiment has a resonant circuit 30 resonating with first RF waves having a frequency of $f_1$ and a wavelength of $\lambda$. The resonant circuit 30 has a sample coil 1, a first transmission line 6, and a second transmission line 7. One end of the first line 6 is connected with a first end 1a of the coil 1. One end of the second line 7 is connected with a second end 1b of the coil 1. The other end of the first line 6 is grounded. The other end of the second line 7 is electrically opened. The first line 6 and second line 7 may include reactance elements (not shown). It is assumed that the frequency $f_1$ of the first waves is the resonant frequency of hydrogen atoms in NMR measurements. Accordingly, in practice, the frequency is of the order of hundreds of MHz.

The NMR probe according to the present embodiment has a first connector 11 from which the first RF waves having a frequency of $f_1$ are entered and a first matching circuit 10 for entering the first RF waves into the resonant circuit 30. The resonant circuit 30 and first matching circuit 10 may be directly connected together. Alternatively, they may be magnetically coupled using a magnetic coupling coil 62 as shown in FIG. 23.

The NMR probe may include an electromagnetic shield 50 having an opening 55 in the same way as in the first embodiment. In this structure, the first line 6 and second line 7 are not required to be parallel to each other. Instead, they may be arranged along a straight line.

Let $L_s$ be the transmission line length of the conductor of the sample coil 1. Let $L_a$ be the transmission line length of the first transmission line 6. Let $L_b$ be the transmission line length of the second transmission line 7. The sum of the transmission line lengths is indicated by $L_n$. The length of the extension line 2 is included in the length $L_a$. The length of the extension line 3 is included in the length $L_b$.

In order to resonate the resonant circuit 30 at the frequency $f_1$ of the first waves, the total transmission line length $L_n$ is set to a value at which the following Eq. (2) is satisfied.

$$L_n = (3/4) \times \lambda + (n-1) \times \lambda/2 \ (n=1, 2, 3, \dots) \quad (2)$$

where n is a positive integer.

Where the sample coil 1 is a solenoid coil, the transmission line length $L_s$ of the coil 1 is a length taken along the contour of the coil in three dimensions in calculating the transmission line length $L_s$ of the coil 1. Where the width of the transmission line cannot be neglected compared with the transmission line of the solenoid coil, or where the transmission line branches into plural routes, the shortest path length taken along the surface of the conductor forming the transmission line is taken into consideration.

The resonant circuit 30 operated under the condition where n is set to 1 (n=1) in Eq. (2) is shown at the upper stage of FIG. 11(a). The diagram at the upper stage of FIG. 11(a) is obtained by expanding the resonant circuit 30 shown in FIG. 10 along a straight line. The first matching circuit 10 and first connector 11 are omitted. In this resonant circuit 30, the transmission line length $L_s$ of the sample coil 1 is set to $\lambda/4$. The total length of the transmission lines connected with the sample coil is set to $1/2\lambda$. One end of the first line 6 is electrically opened. One end of the second line 7 is grounded. The transmission line length $L_s$ is set to $\lambda/4$ but the length is not limited to this value.

The lower stage of FIG. 11(a) shows the magnetic field distribution in the resonant circuit 30 under the condition where n=1 when the first RF waves having the frequency $f_1$ are applied.

As described previously, standing waves having the RF frequency $f_1$ are produced in the resonant circuit 30. At this time, a maximal point of the magnetic field strength appears in the resonant circuit 30 steadily. Therefore, the center of the sample coil 1 is placed at the maximal point of the magnetic field strength.

If the total transmission line length $L_n$ is determined, the point at which the magnetic field strength is maximized can be easily identified. For example, where n=1, the total transmission line length $L_n$ becomes equal to $\lambda$. Therefore, the magnetic field strength is maximized at a point spaced from the grounded point by a distance of $(1/2)\lambda$. If the integer n is two or more, the magnetic field strength has plural maximal points in the resonant circuit. Accordingly, the number of locations where the sample coil 1 can be placed is increased.

According to the magnetic field distribution shown in FIG. 11(a), it can be seen that if the transmission line length $L_s$ of the sample coil 1 is set equal to or less than $\lambda/4$, variations in the magnetic field strength in the sample coil decrease. Therefore, the magnetic field strength in the sample coil 1 can be brought closer to a uniform distribution by adjusting the transmission line length $L_s$ of the coil 1.

Figure 11:
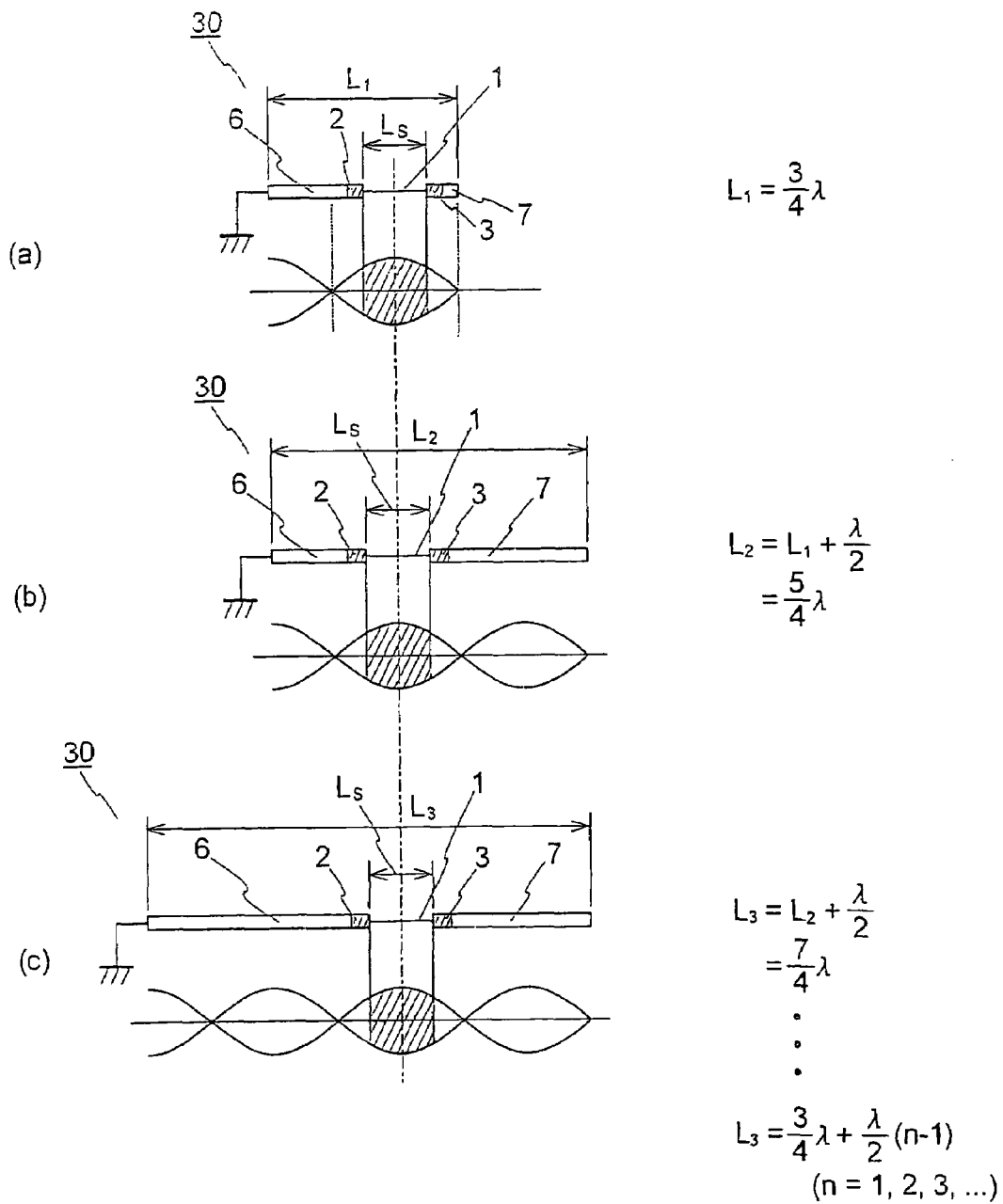
FIG. 11 illustrates the principle of operation of NMR probes according to the second embodiment of the invention.

FIG. 11, (b) and (c), shows the configuration of the resonant circuit 30 satisfying Eq. (2) and the magnetic field distribution in cases where n=2 and n=3, respectively. As described previously, the number of maximal points of the magnetic field strength in the resonant circuit 30 increases in proportion to the integer n.

In order that the maximal point of the magnetic field strength in the resonant circuit 30 satisfying Eq. (2) be placed in the center of the sample coil 1, the total transmission line length $L_n$ is first determined. The position on the circuit at which the magnetic field strength maximizes, i.e., the center position of the coil 1, is determined. Then, the transmission line length $L_s$ of the coil 1 of the circuit is determined. Thereafter, the transmission line length of the first line 6 and the transmission line length of the second line 7 are calculated so as to satisfy Eq. (2). Both lines 6 and 7 are connected with the opposite ends of the sample coil 1.

If the resonant circuit 30 is designed in this way, an intense magnetic field can be produced in the sample coil 1 in NMR measurements, and the magnetic field emanating from the sample can be detected with high sensitivity.

The description of the resonant circuit 30 described above is based on the assumption that the sample coil 1, first transmission line 6, second transmission line 7, and ground are directly connected. Coupling circuits or impedance circuits via which those components are connected may also be provided.

Figure 12:
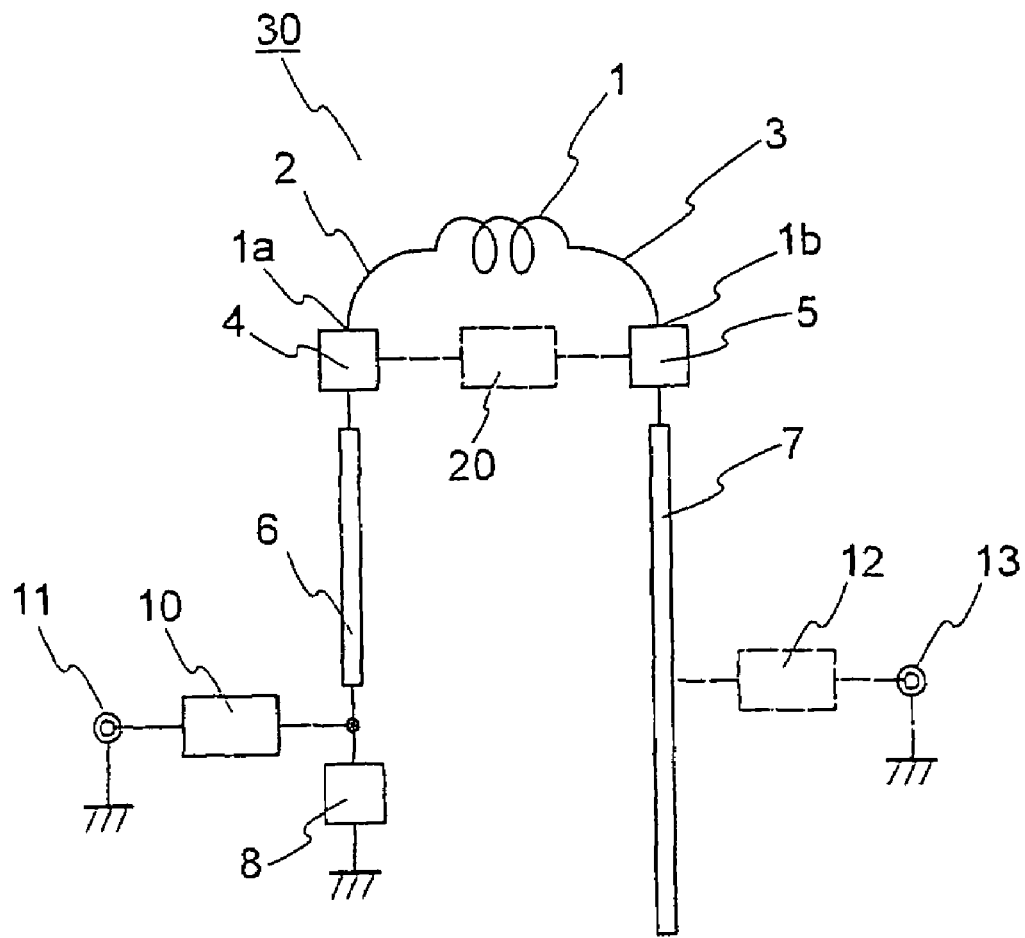
FIG. 12 is a diagram similar to FIG. 10, but in which coupling circuits, impedance circuits, and a matching circuit are added.

FIG. 12 is a diagram of the present embodiment, and in which coupling circuits and impedance circuits are added. As shown in FIG. 12, a first coupling circuit 4 is connected between the first end 1a of the sample coil 1 and the first transmission line 6 to couple them. A second coupling circuit 5 is connected between the second end 1b of the coil 1 and the second transmission line 7 to couple them. The first line 6 is grounded via a first impedance circuit 8.

Each of the first and second coupling circuits 4 and 5, respectively, includes a variable impedance element for tuning the resonant circuit 30 to the first RF frequency $f_1$, second RF frequency $f_2$, or third RF frequency $f_3$. $F_2$ and $F_3$ will be described later. Furthermore, each of the coupling circuits 4 and 5 includes a connector for connection of the sample coil 1.

The impedance circuit 8 shows low impedances for the first, second, and third RF waves having frequencies of $f_1$, $f_2$, and $f_3$, respectively. $F_2$ and $F_3$ will be described later. Therefore, the configuration is substantially equivalent to a circuit in which the first transmission line 6 is directly grounded. The first and second coupling circuits 4 and 5 may all be added. Alternatively, any one of them may be added.

Where the coupling circuits 4, 5 are added to the resonant circuit 30, the transmission line length $L_s$ of the conductor of the sample coil 1, the transmission line length $L_a$ of the first line, and the transmission line length $L_b$ of the second line are appropriately corrected taking account of the impedances of the circuits 4 and 5. The total transmission line length $L_n$ is made to comply with Eq. (2).

Because the resonant circuit 30 has the total transmission line length $L_n$ complying with Eq. (2), the resonant circuit resonates at the first RF frequency $f_1$. Accordingly, an intense magnetic field is set up in the sample coil 1 in NMR measurements. The magnetic field produced from the sample can be detected with good sensitivity.

Furthermore, in the NMR probe according to the present embodiment, at least one third impedance circuit 20 may be added between the first transmission line 6 and the second transmission line 7 to couple them. The impedance circuit 20 indicated by the broken line in FIG. 12 includes impedance elements for tuning the resonant circuit 30 to the first RF frequency $f_1$, second RF frequency $f_2$, or third RF frequency $f_3$. The frequencies $f_2$ and $f_3$ will be described later. Also, in this case, the transmission line length $L_s$ of the conductor of the sample coil 1, the transmission line length $L_a$ of the first line, and the transmission line length $L_b$ of the second line are appropriately corrected taking account of the impedances of the impedance circuit 20. The total transmission line length $L_n$ is made to comply with Eq. (2).

The NMR probe according to the present embodiment may have a connector 13 from which the second RF waves having the frequency $f_2$ are applied and a second matching circuit 12 for entering the second RF waves into the resonant circuit 30. These are indicated by the broken lines in FIG. 12. The frequency of the second RF waves used in general NMR measurements is a fraction of the frequency $f_1$ of the first RF waves and does not affect the configuration of the resonant circuit 30 complying with Eq. (2). Therefore, it is possible to apply the second RF waves to the resonant circuit 30 while it is resonating with the first RF waves. The first and second RF waves can be superimposed in the resonant circuit 30.

RF waves may be supplied not only to the transmission line 6 but also to the transmission line 7 from the first connector 11 via the matching circuit 10. In this structure, the RF waves applied to the lines 6 and 7 produce a phase difference of about 180°.

Figure 13:
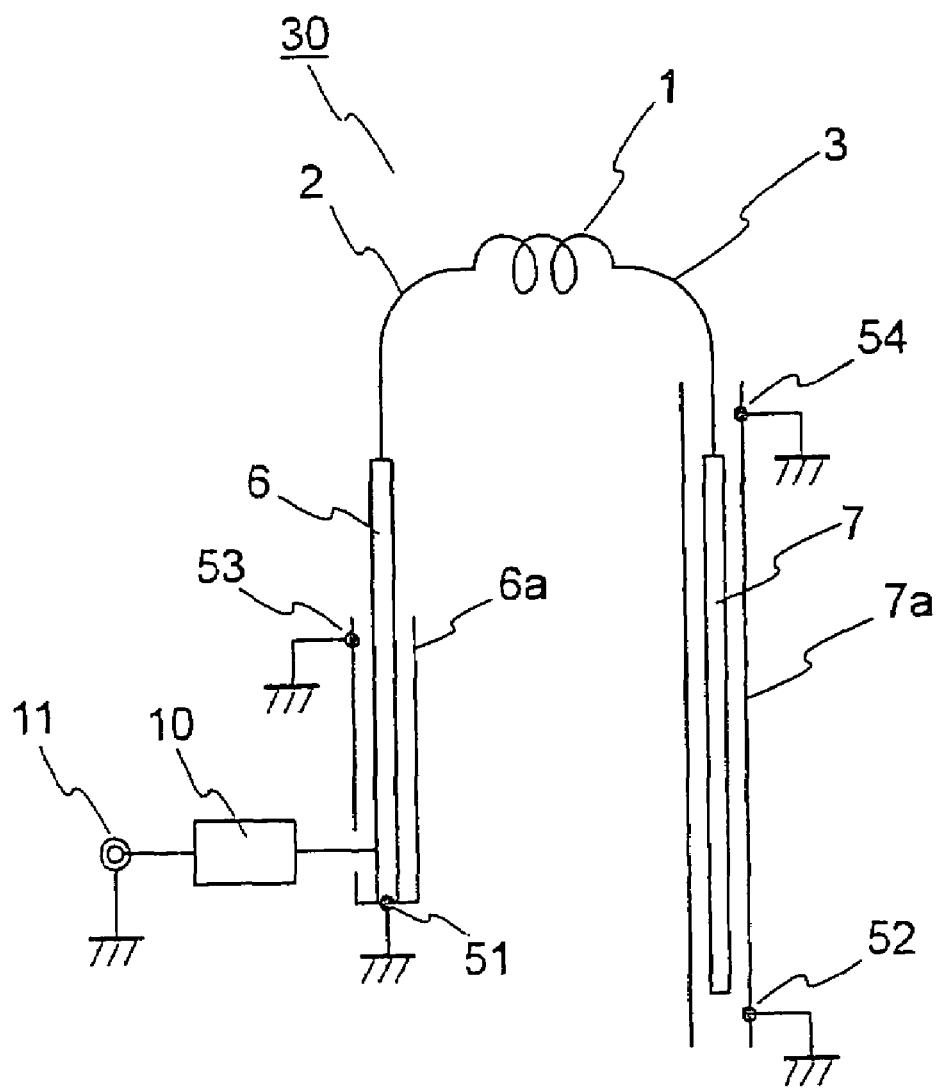
FIG. 13 is a diagram similar to FIG. 10, but in which coaxial cables are used.

In the NMR probe according to the present embodiment, each of the first transmission line 6 and second transmission line 7 may be made of a coaxial cable having an outer conductor layer. FIG. 13 is a diagram of the resonant circuit in which each of the transmission lines 6 and 7 is made of a coaxial cable. The inner conductors of the coaxial cables correspond to the first transmission line 6 and the second transmission line 7, respectively. The outer conductor layer 6a of one coaxial cable is grounded at its ends 51 and 53. Similarly, the outer conductor layer 7a of the other coaxial cable is grounded at its ends 52 and 54. The transmission line lengths $L_a$ and $L_b$ of the first line 6 and second line 7 are corrected taking account of variations in electrical characteristics produced between the outer conductor layer and inner conductor. The resonant circuit 30 resonating at the first RF frequency $f_1$ is designed by applying Eq. (2) to the corrected transmission line lengths $L_a$ and $L_b$.

Where RF waves are applied from one of the two coaxial cables 6 and 7 connected with the coil as shown in FIG. 13, the outer conductor layers 6a and 7a of the coaxial cables hinder the coupling between the transmission lines 6 and 7 as described in the first embodiment. It is difficult to enhance the efficiency of the resonant circuit 30. Each of the outer conductor layers 6a and 7a usually assumes a seamless geometry. However, to avoid the aforementioned problem, the outer conductor layers 6a and 7a may have holes 60 or a slit 61. One example of the structure of these outer conductor layers is similar to the structure already described in the first embodiment in connection with FIGS. 7 and 8.

RF waves may be supplied not only to the line 6 but also to the line 7 from the first connector 11 via the matching circuit 10. In this structure, the applied RF waves are so supplied that a phase difference of about 180° is produced between the lines 6 and 7.

Where the transmission line lengths $L_a$ and $L_b$ of the first transmission line 6 and second transmission line 7 are found taking account of variations of electrical characteristics produced in the first line 6 and second line 7 in this way, the resonant circuit 30 can be designed to resonate at the first RF frequency $f_1$ by utilizing Eq. (2).

Figure 14:
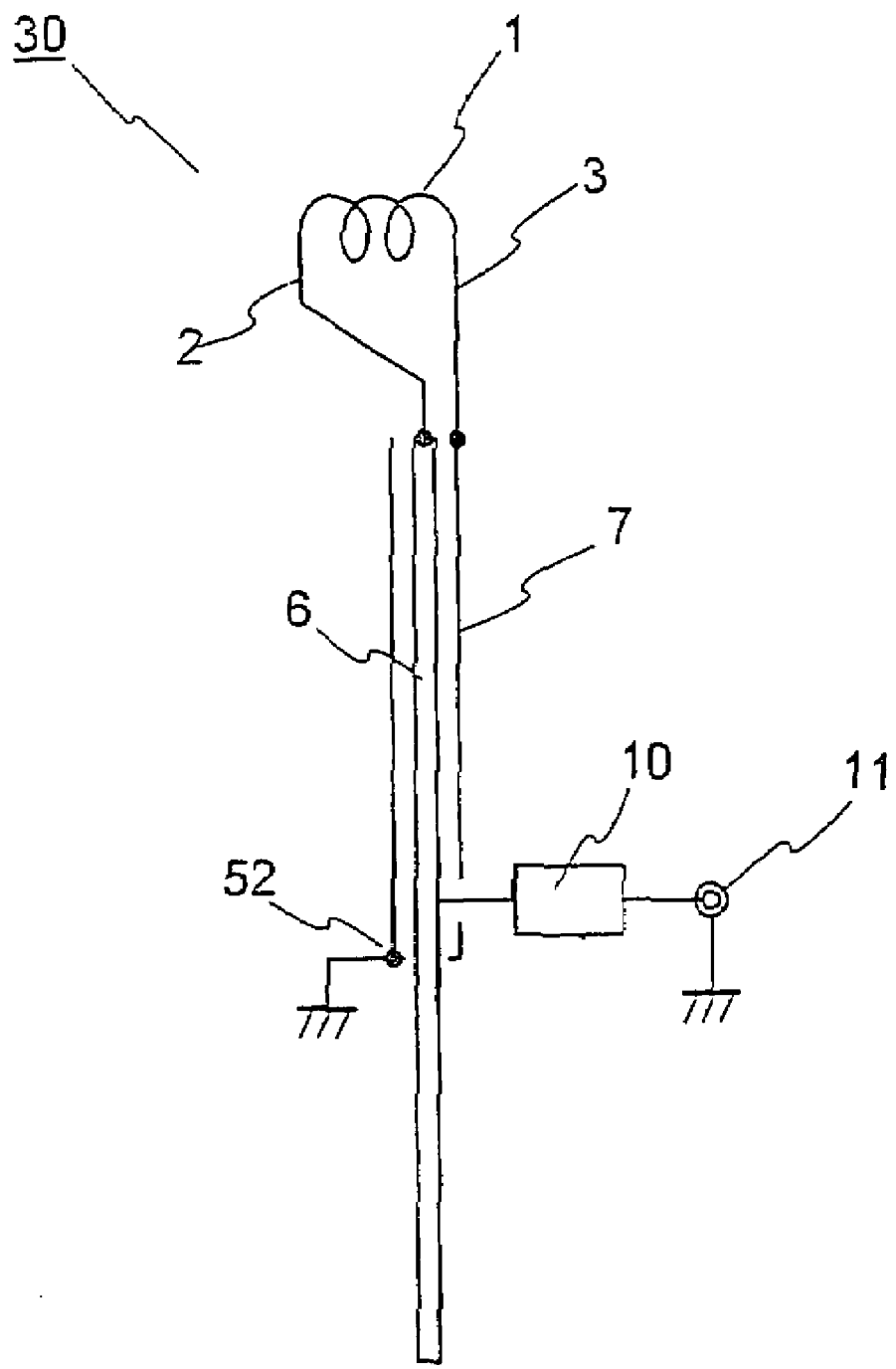
FIG. 14 is a diagram similar to FIG. 10, but in which a coaxial cable is used.

A further example using a coaxial cable is shown in FIG. 14, where the first transmission line 6 forms the inner conductor of the coaxial cable, while the second transmission line 7 forms the outer conductor layer of the cable. One end of the first line 6 is connected with the sample coil 1, the other end being opened. One end of the second line 7 is connected with the coil 1, while the other end is grounded as an end 52 of the coaxial cable. In the same way as in the above examples, the transmission line lengths $L_a$ and $L_b$ of the first line 6 and second line 7, respectively, are corrected taking account of variations in electrical characteristics produced between the outer conductor layer and the inner conductor. The resonant circuit 30 is designed by applying Eq. (2) to the corrected transmission line lengths $L_a$ and $L_b$ such that the resonant circuit 30 resonates at the first RF frequency $f_1$.

In the examples described so far, no restrictions are imposed on the whole shape of the sample coil 1 or on the geometry or material of the conductors as long as the transmission line length $L_s$ can be found. The shape of the winding of the sample coil 1 can be circular or elliptical. Besides, as shown in FIG. 9, (a)-(c), the cross section of the coil may be polygonal such as square as already described in the first embodiment. Moreover, a saddle-shaped coil, Helmholtz coil, or scroll coil may also be used.

Third Embodiment

A third embodiment of the present invention is next described by referring to FIGS. 15-19.

Figure 15:
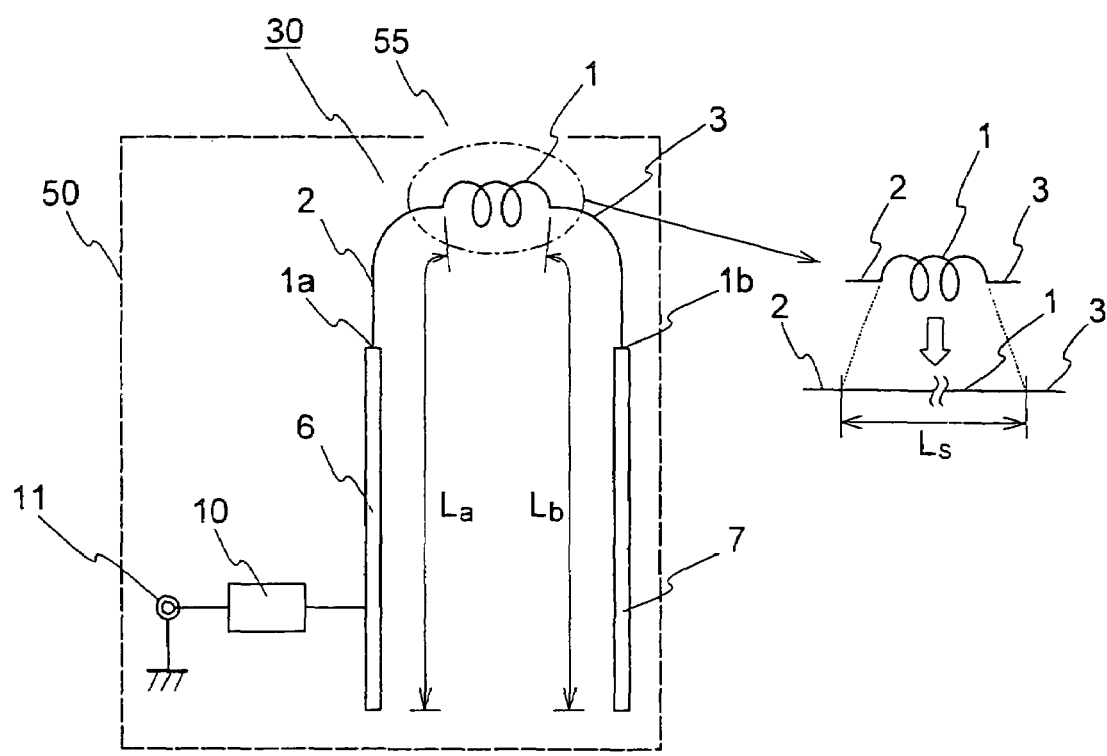
FIG. 15 is a diagram of an NMR probe according to a third embodiment of the invention.

FIG. 15 is a diagram of an NMR probe according to the third embodiment of the invention. As shown in the figure, the NMR probe according to the present embodiment has a resonant circuit 30 resonating with first RF waves having a frequency of $f_1$ and a wavelength of $\lambda$. The resonant circuit 30 has a sample coil 1, a first transmission line 6, and a second transmission line 7. One end of the first line 6 is connected with a first end 1a of the coil 1. One end of the second line 7 is connected with a second end 1b of the coil 1. The other ends of the first line 6 and second line 7 are electrically opened. The first line 6 and second line 7 may include reactance elements (not shown). It is assumed that the frequency $f_1$ of the first RF waves is the resonant frequency of hydrogen atoms in NMR measurements. Accordingly, in practice, the frequency is of the order of hundreds of MHz.

The NMR probe according to the present embodiment further includes a first connector 11 from which the first RF waves having a frequency of $f_1$ are applied and a first matching circuit 10 for entering the first RF waves into the resonant circuit 30. The resonant circuit 30 and first matching circuit 10 may be directly connected together. Alternatively, they may be magnetically coupled using a magnetic coupling coil 62 as shown in FIG. 23.

The NMR probe may include an electromagnetic shield 50 having an opening 55 in the same way as in the first embodiment. In this structure, the first line 6 and second line 7 are not required to be parallel to each other. Instead, they may be arranged along a straight line.

Let $L_s$ be the transmission line length of the conductor of the sample coil 1. Let $L_a$ be the length of the first transmission line 6. Let $L_b$ be the length of the second transmission line 7. The sum of these transmission line lengths is denoted by $L_n$. The transmission line length of the extension line 2 is included in the transmission line length $L_a$. The transmission line length of the extension line 3 is included in the transmission line length $L_b$.

In order to resonate the resonant circuit 30 at the frequency $f_1$ of the first waves, the total transmission line length $L_n$ is set to a value at which the following Eq. (3) is satisfied.

$$L_n = n \times \lambda/2 \ (n=1, 2, 3, \ldots) \quad (3)$$

where n is a positive integer.

Where the sample coil 1 is a solenoid coil, the transmission line length $L_s$ of the coil 1 is a length taken along the contour of the coil in three dimensions in calculating the transmission line length $L_s$ of the coil 1. Where the width of the transmission line cannot be neglected compared with the transmission line length of the solenoid coil, or where the transmission line branches into plural routes, the shortest path length taken along the surface of the conductor forming the transmission line is taken into consideration.

The resonant circuit 30 operated under the condition where n is set to 1 (n=1) in Eq. (3) is shown at the upper stage of FIG. 16(a). The diagram at the upper stage of FIG. 16(a) is obtained by expanding the resonant circuit 30 shown in FIG. 15 along a straight line. The first matching circuit 10 and first connector 11 are omitted. In this resonant circuit 30, the transmission line length $L_s$ of the sample coil 1 is set to $\lambda/4$. The total transmission line length of the transmission lines connected with the sample coil is set to $\frac{1}{2}\lambda$. One end of the first line 6 and one end of the second line 7 are electrically opened. The transmission line length $L_s$ is set to $\lambda/4$ but the length is not limited to this value.

The lower stage of FIG. 16(a) shows the magnetic field distribution in the resonant circuit 30 when the first RF waves having the frequency $f_1$ are applied.

As described previously, standing waves having the RF frequency $f_1$ are produced in the resonant circuit 30. At this time, a maximal point of the magnetic field strength appears in the resonant circuit 30 steadily. Therefore, the center of the sample coil 1 is placed at the maximal point of the magnetic field strength.

If the total transmission line length $L_n$ is determined, the point at which the magnetic field strength is maximized in this way can be easily identified. For example, where n=1, the total transmission line length $L_n$ becomes equal to $\lambda$. Therefore, the magnetic field strength is maximized at a point spaced from the open end either of the first line 6 or of the second line 7 by a distance of $(\frac{1}{2})\lambda$. If the integer n is two or more, the magnetic field strength has plural maximal points in the resonant circuit. Accordingly, the number of locations where the sample coil 1 can be placed is increased.

According to the magnetic field distribution shown in FIG. 16(a), it can be seen that if the transmission line length $L_s$ of the sample coil 1 is set equal to or less than $\lambda/4$, variations in the magnetic field strength in the sample coil decrease. Therefore, the magnetic field strength in the sample coil 1 can be brought closer to a uniform distribution by adjusting the transmission line length $L_s$ of the coil 1.

Figure 16:
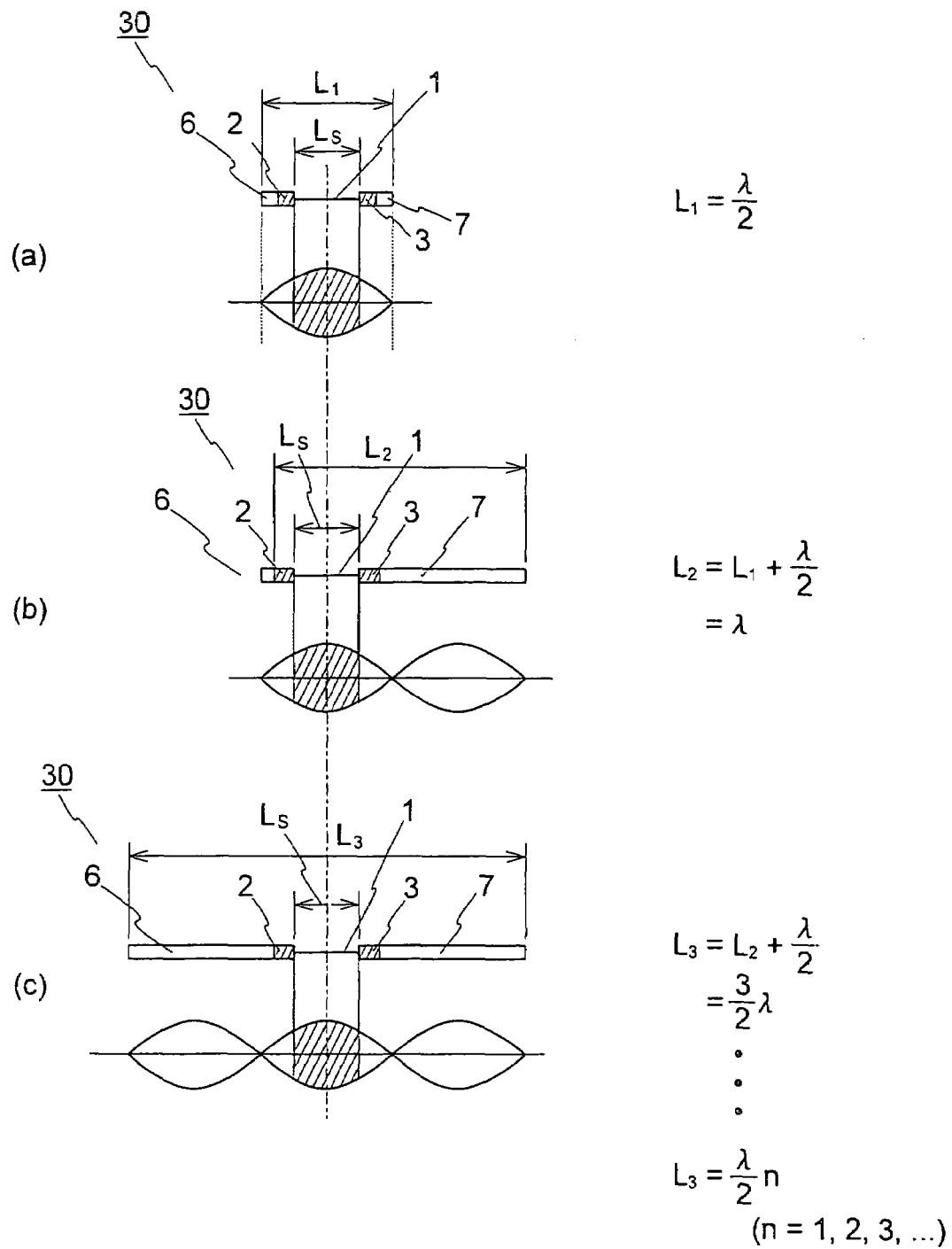
FIG. 16 illustrates the principle of operation of NMR probes according to the third embodiment of the invention.

FIG. 16, (b) and (c), shows the configuration of the resonant circuit 30 satisfying Eq. (3) and the magnetic field distribution in cases where n=2 and n=3, respectively. As described previously, the number of maximal points of the magnetic field strength in the resonant circuit 30 increases in proportion to the integer n.

In order that the maximal point of the magnetic field strength in the resonant circuit 30 satisfying Eq. (3) be placed in the center of the sample coil 1, the total transmission line length $L_n$ is first determined. The position on the circuit at which the magnetic field strength maximizes, i.e., the center position of the coil 1, is determined. Then, the transmission line length $L_s$ of the coil 1 of the circuit is determined. Thereafter, the transmission line length of the first line 6 and the transmission line length of the second line 7 are calculated so as to satisfy Eq. (3). Both lines 6 and 7 are connected with the opposite ends of the sample coil 1.

If the resonant circuit 30 is designed in this way, an intense magnetic field can be produced in the sample coil 1 in NMR measurements, and the magnetic field emanating from the sample can be detected with high sensitivity.

The description of the resonant circuit 30 described above is based on the assumption that the sample coil 1, first transmission line 6, and second transmission line 7 are directly connected. Coupling circuits or impedance circuits via which those components are connected may also be provided.

Figure 17:
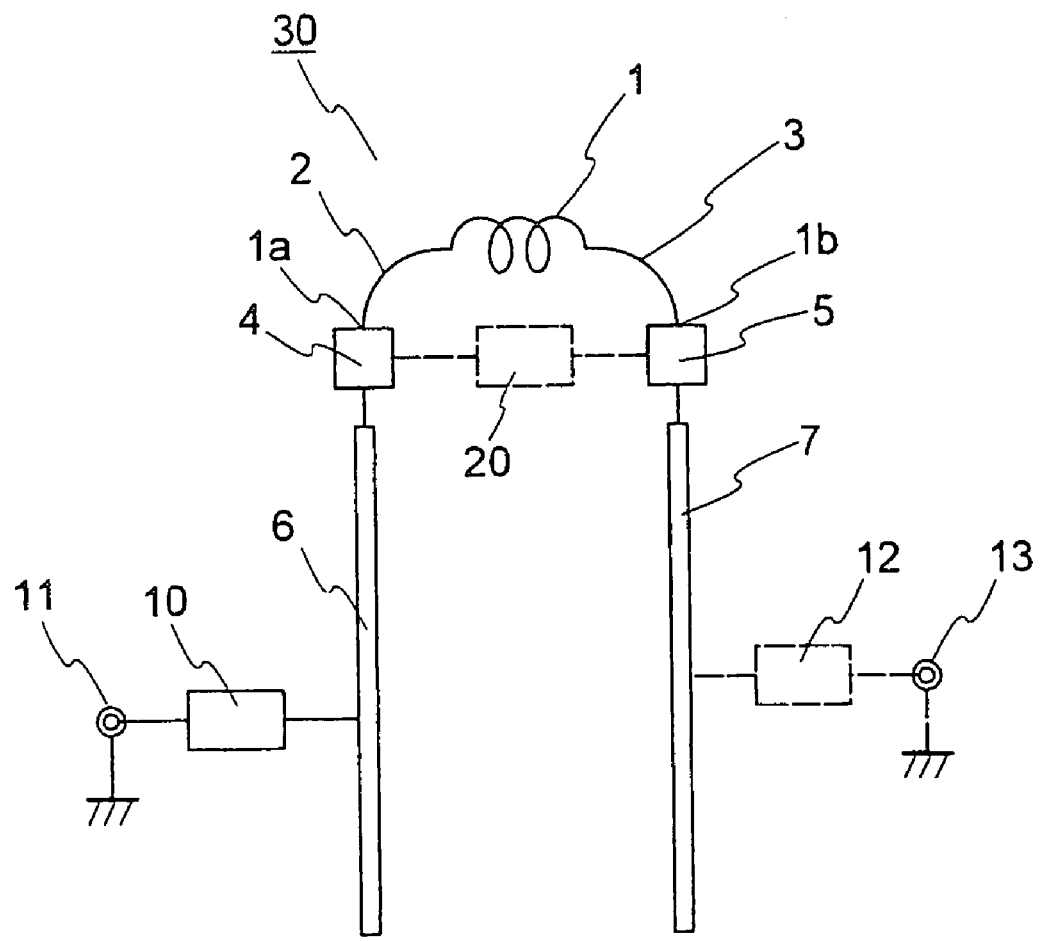
FIG. 17 is a diagram of an NMR probe according to the third embodiment of the invention, and in which coupling circuits, impedance circuits, and a matching circuit are added.

FIG. 17 is a diagram of the present embodiment, and in which coupling circuits and impedance circuits are added. As shown in FIG. 17, a first coupling circuit 4 is connected between the first end 1a of the sample coil 1 and the first transmission line 6 to couple them. A second coupling circuit 5 is connected between the second end 1b of the coil 1 and the second transmission line 7 to couple them.

Each of the first and second coupling circuits 4 and 5, respectively, includes a variable impedance element for tuning the resonant circuit 30 to the first RF frequency $f_1$, second RF frequency $f_2$, or third RF frequency $f_3$. $F_2$ and $F_3$ will be described later. Furthermore, each of the coupling circuits 4 and 5 includes a connector for connection of the sample coil 1. The first and second coupling circuits 4 and 5 may all be added. Alternatively, any one of them may be added.

Where the coupling circuits 4, 5 are added to the resonant circuit 30, the transmission line length $L_s$ of the conductor of the sample coil 1, the transmission line length $L_a$ of the first line, and the transmission line length $L_b$ of the second line are appropriately adjusted taking account of the impedances of the circuits 4 and 5. The total transmission line length $L_n$ is made to comply with Eq. (3).

Because the resonant circuit 30 has the total transmission line length $L_n$ complying with Eq. (3), the resonant circuit resonates at the first RF frequency $f_1$. Accordingly, an intense magnetic field is set up in the sample coil 1 in NMR measurements. The magnetic field produced from the sample can be detected with good sensitivity.

Furthermore, in the NMR probe according to the present embodiment, at least one third impedance circuit 20 may be added between the first transmission line 6 and the second transmission line 7 to couple them. The impedance circuit 20 indicated by the broken line in FIG. 17 includes impedance elements for tuning the resonant circuit 30 to the first RF frequency $f_1$, second RF frequency $f_2$, or third RF frequency $f_3$. The frequencies $f_2$ and $f_3$ will be described later. Also, in this structure, the transmission line length $L_s$ of the conductor of the sample coil 1, the transmission line length $L_a$ of the first line, and the transmission line length $L_b$ of the second line are appropriately adjusted taking account of the impedances of the third impedance circuit 20. The total transmission line length $L_n$ is made to comply with Eq. (3).

The NMR probe according to the present embodiment may have a connector 13 from which the second RF waves having the frequency $f_2$ are applied and a second matching circuit 12 for entering the second RF waves into the resonant circuit 30. These are indicated by the broken lines in FIG. 17. The frequency of the second RF waves used in general NMR measurements is a fraction of the first RF frequency $f_1$ and does not affect the configuration of the resonant circuit 30 complying with Eq. (3). Therefore, it is possible to apply the second RF waves to the resonant circuit 30 while it is resonating with the first RF waves. The first and second RF waves can be superimposed in the resonant circuit 30.

RF waves may be supplied not only to the transmission line 6 but also to the transmission line 7 from the first connector 11 via the matching circuit 10. In this structure, the RF waves applied to the lines 6 and 7 produce a phase difference of about 180°.

Figure 18:
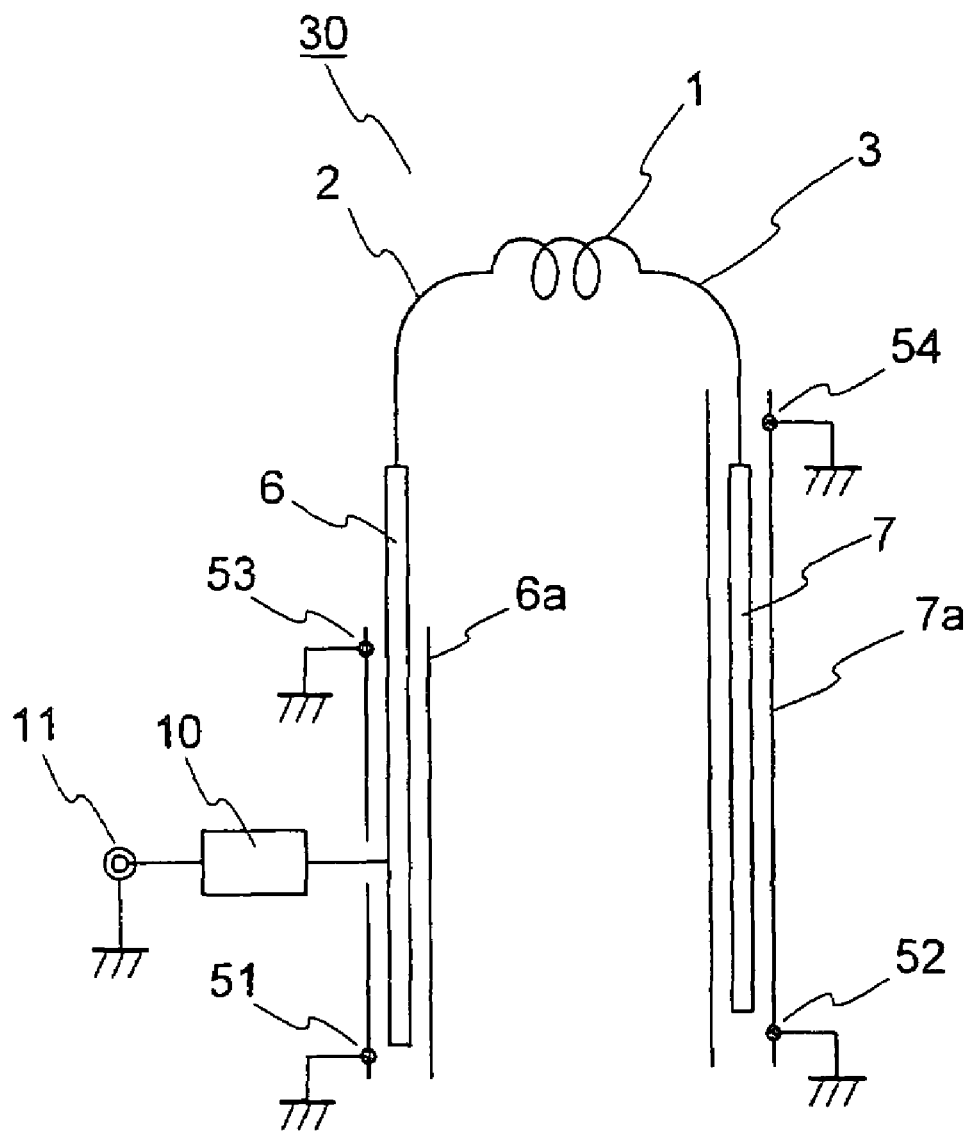
FIG. 18 is a diagram similar to FIG. 17, but in which coaxial cables are used.

In the NMR probe according to the present embodiment, each of the first transmission line 6 and second transmission line 7 may be made of a coaxial cable having an outer conductor layer. FIG. 18 is a diagram of the resonant circuit in which each of the transmission lines 6 and 7 is made of a coaxial cable. The inner conductors of the coaxial cables correspond to the first transmission line 6 and the second transmission line 7, respectively. The outer conductor layer 6a of one coaxial cable is grounded at its both ends 51 and 53. Similarly, the outer conductor layer 7a of the other coaxial cable is grounded at its both ends 52 and 54. The transmission line lengths $L_a$ and $L_b$ of the first line 6 and second line 7 are found taking account of reactance produced between the outer conductor layer and inner conductor. The resonant circuit 30 resonating at the first RF frequency $f_1$ is designed by applying Eq. (3) to the found transmission line lengths $L_a$ and $L_b$.

Where RF waves are applied from one of the two coaxial lines 6 and 7 connected with the coil as shown in FIG. 18, the outer conductor layers 6a and 7a of the coaxial cables hinder the coupling between the transmission lines 6 and 7 as described in the first embodiment. It is difficult to enhance the efficiency of the resonant circuit 30. Each of the outer conductor layers 6a and 7a usually assumes a seamless geometry. However, to avoid the aforementioned problem, the outer conductor layers 6a and 7a may have holes 60 or a slit 61. One example of the structure of these outer conductor layers is similar to the structure already described in the first embodiment in connection with FIGS. 7 and 8. RF waves may be supplied not only to the line 6 but also to the line 7 from the first connector 11 via the matching circuit 10. In this structure, the applied RF waves are so supplied that a phase difference of about 180° is produced between the lines 6 and 7.

Where the transmission line lengths $L_a$ and $L_b$ of the first transmission line 6 and second transmission line 7 are found taking account of the reactance produced between the first line 6 and second line 7 in this way, the resonant circuit 30 can be designed to resonate at the first RF frequency $f_1$ by utilizing Eq. (3).

Figure 19:
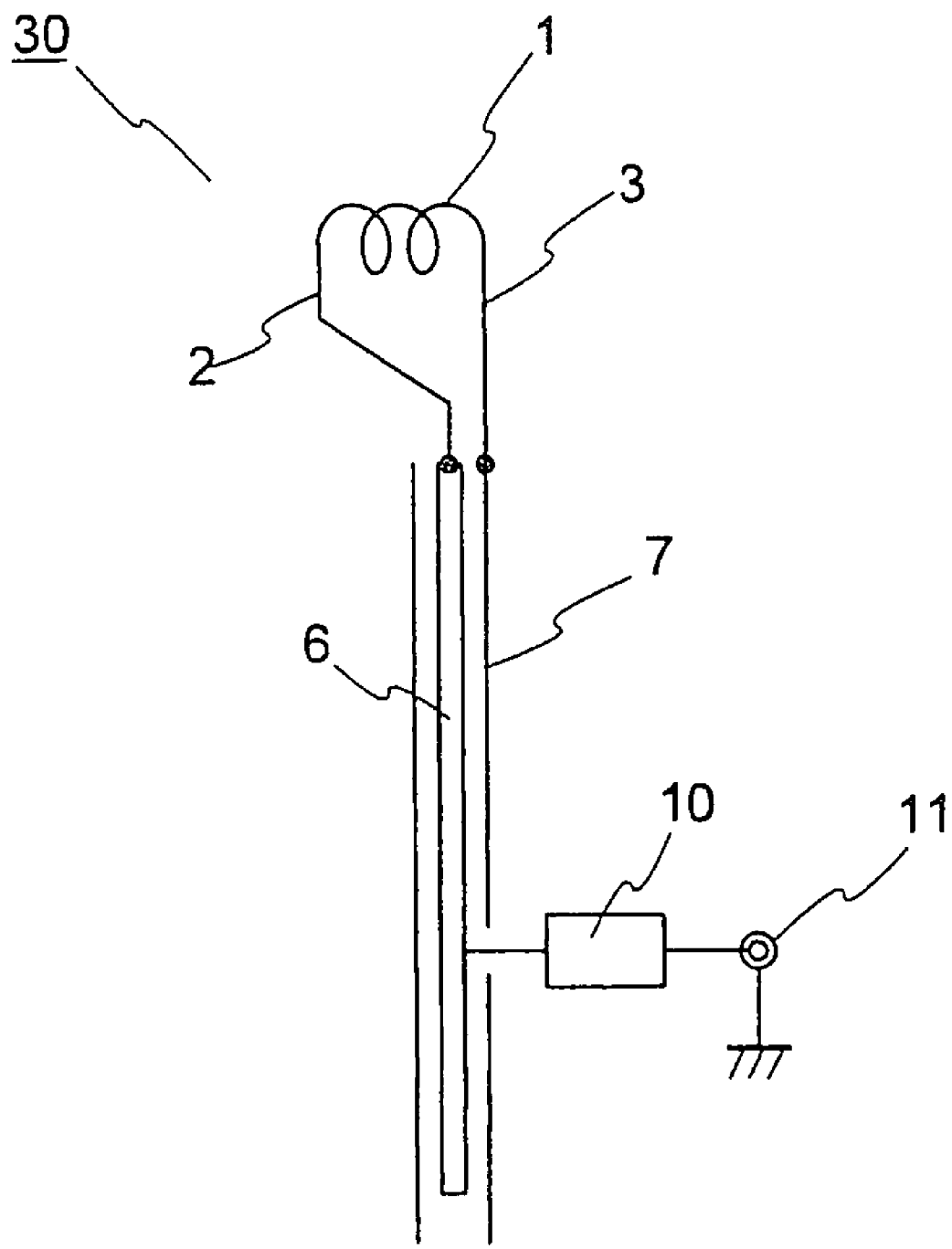
FIG. 19 is a diagram of an NMR probe according to the third embodiment of the invention, and in which a coaxial cable is used.

A further example using a coaxial cable is shown in FIG. 19, where the first transmission line 6 forms the inner conductor of the coaxial cable, while the second transmission line 7 forms the outer conductor layer of the cable. One end of the first line 6 and one end of the second line 7 are connected with the sample coil 1. The other ends are opened. In the same way as in the above examples, the transmission line lengths $L_a$ and $L_b$ of the first line 6 and second line 7, respectively, are found taking account of variations in electrical characteristics produced between the outer conductor layer and the inner conductor. The resonant circuit 30 is designed by applying Eq. (3) to the found transmission line lengths $L_a$ and $L_b$ such that the resonant circuit 30 resonates at the first RF frequency $f_1$.

In the examples described so far, no restrictions are imposed on the whole shape of the sample coil 1 or on the geometry or material of the conductors as long as the transmission line length $L_s$ can be found. The shape of the winding of the sample coil 1 can be circular or elliptical. Besides, as shown in FIG. 9, (a)-(c), the cross section of the coil may be polygonal such as square. Moreover, a saddle-shaped coil, Helmholtz coil, or scroll coil may also be used.

Fourth Embodiment

A fourth embodiment of the present invention is next described by referring to FIGS. 20-24.

Figure 20:
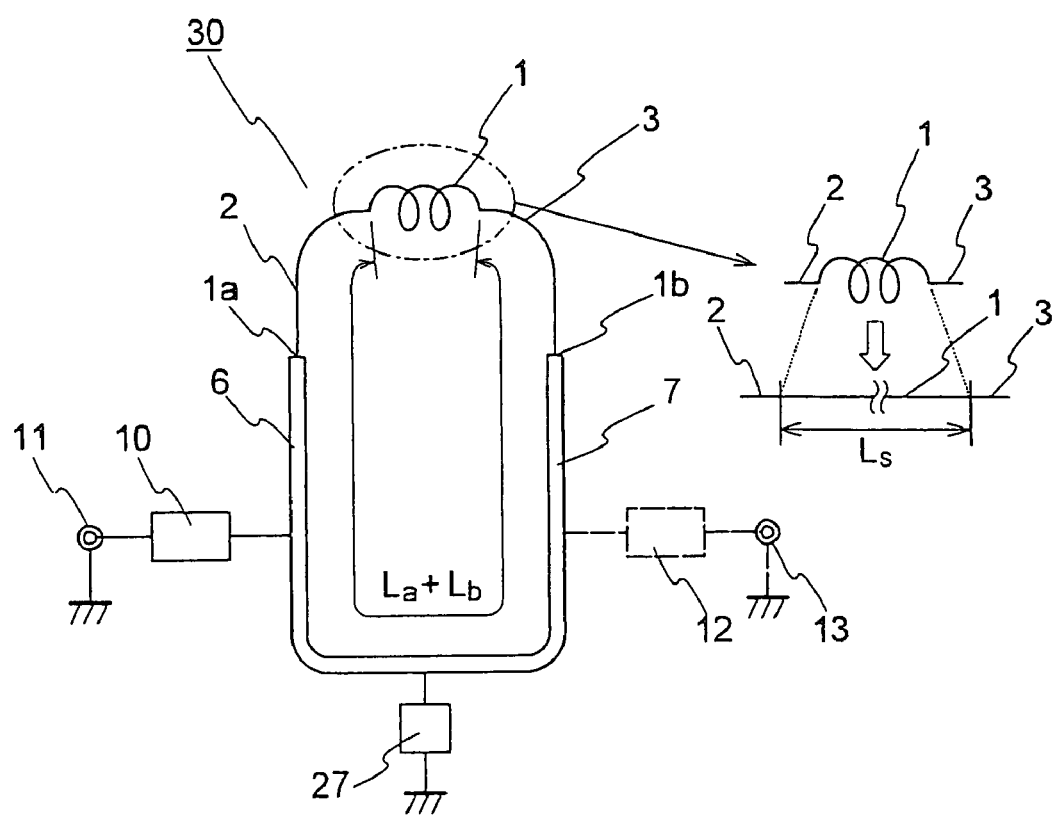
FIG. 20 is a diagram of an NMR probe according to a fourth embodiment of the invention.

FIG. 20 is a diagram of an NMR probe according to the fourth embodiment of the invention. As shown in the figure, the NMR probe according to the present embodiment has a resonant circuit 30 resonating with first RF wave having a frequency of $f_1$ and a wavelength of $\lambda$. The resonant circuit 30 has a sample coil 1, a first transmission line 6, and a second transmission line 7. The sample coil 1 is made of a solenoid coil, saddle coil, Helmholtz coil, or foil-like coil (scroll coil).

One end of the first line 6 is connected with a first end 1a of the coil 1. One end of the second line 7 is connected with a second end 1b of the coil 1. The other ends of the first line 6 and second line 7 are connected together. In the sample coil 1, the first transmission line 6 and second transmission line 7 together form a ring circuit. The first line 6 and second line 7 may include reactance elements (not shown). It is assumed that the frequency $f_1$ of the first waves is the resonant frequency of hydrogen atoms in NMR measurements. Accordingly, in practice, the frequency is of the order of hundreds of MHz.

The NMR probe according to the present embodiment further includes a first connector 11 from which the first RF waves having a frequency of $f_1$ are applied and a first matching circuit 10 for entering the first RF waves into the resonant circuit 30. The resonant circuit 30 and first matching circuit 10 are magnetically coupled using a magnetic coupling coil 62 as shown in FIG. 23. Another method of connection is to produce electric currents flowing in directions indicated by $I_1$ and $I_2$ as shown in FIG. 23 while the resonant circuit 30 is resonating at the first RF frequency $f_1$. That is, the electric currents flowing on both sides of the magnetic coupling coil 62 are directed in the same direction near the coil 62 in the resonant circuit 30.

The electromagnetic shield having an opening as described in the first embodiment may be mounted around the resonant circuit 30.

Let $L_s$ be the transmission line length of the conductor of the sample coil 1. Let $L_a$ be the length of the first transmission line 6. Let $L_b$ be the length of the second transmission line 7. The sum of these transmission line lengths is denoted by $L_n$. The transmission line length of the extension line 2 is included in the length $L_a$. The transmission line length of the extension line 3 is included in the transmission line length $L_b$.

In order to resonate the resonant circuit 30 at the first RF frequency $f_1$, the total transmission line length $L_n$ is set to a value at which the following Eq. (4) is satisfied.

$$L_n = n \times \lambda (n = 1, 2, 3, \ldots) \quad (4)$$

where n is a positive integer.

Where the sample coil 1 is a solenoid coil, the transmission line length $L_s$ of the coil 1 is a length taken along the contour of the coil in three dimensions in calculating the transmission line length $L_s$ of the coil 1. Where the width of the transmission line cannot be neglected compared with the transmission line length of the solenoid coil, or where the transmission line branches into plural routes, the shortest path length taken along the surface of the conductor forming the transmission line is taken into consideration.

The resonant circuit 30 operated under the condition where n=1 in the Eq. (4) is shown in FIG. 21(a). The left part of FIG. 21(a) has been obtained by expanding the resonant circuit 30 shown in FIG. 20 into an annular form. The first and second matching circuits 10, 12 and first and second connectors 11, 13 are omitted. In the resonant circuit, the transmission line length $L_s$ of the sample coil 1 is set to $\lambda/4$. The total transmission line length of the transmission lines connected with the sample coil is set to $(3/4)\lambda$. Although the transmission line length $L_s$ is set to $\lambda/4$, this line length is not limited to this value.

The right part of FIG. 21(a) shows the magnetic field distribution occurring when the first RF field having the frequency $f_1$ is applied to the resonant circuit. In this figure, the dot-and-dash line indicates the position of the resonant circuit 30. The distribution of the magnetic field strength is indicated by the solid line.

According to the magnetic field distribution shown in FIG. 21(a), it can be seen that if the transmission line length $L_s$ of the sample coil 1 is set equal to or less than $\lambda/4$, variations in the magnetic field strength in the sample coil decrease. Therefore, the magnetic field strength in the sample coil 1 can be brought closer to a uniform distribution by adjusting the transmission line length $L_s$ of the coil 1.

Figure 21:
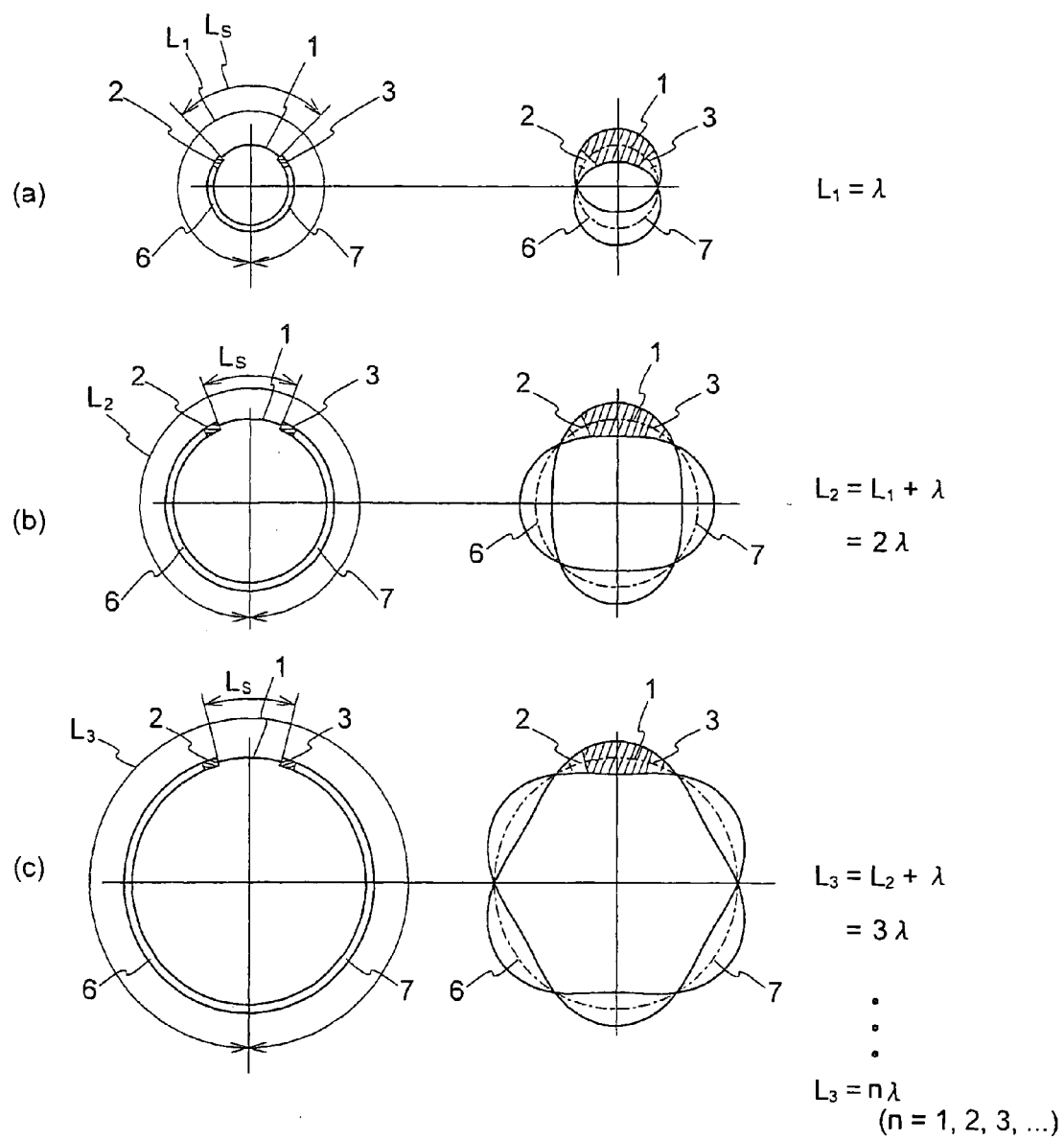
FIG. 21 illustrates the principle of operation of NMR probes according to the fourth embodiment of the invention.

FIG. 21, (b) and (c), shows the configuration of the resonant circuit 30 satisfying Eq. (4) and the magnetic field distribution in cases where n=2 and n=3, respectively. If the integer n is two or more, the magnetic field strength has plural maximal points in the resonant circuit 30 in this way.

As described previously, standing waves of the first RF waves having the frequency $f_1$ are produced in the resonant circuit 30. At this time, a minimal point of the electric field strength appears in the resonant circuit 30. Conversely, a maximal point of the magnetic field strength appears in the same location. Accordingly, the center of the sample coil 1 is placed at the maximal point of the magnetic field strength. However, in the present embodiment, the resonant circuit is made of a ring circuit and so the maximal point of the magnetic field strength is not determined. In order that the maximal point of the magnetic field be fixed at a given position within the resonant circuit 30, the first impedance circuit 27 is connected between the resonant circuit and ground. The impedance circuit 27 has an arbitrary impedance including a time delay element. For example, a lead wire or capacitive element is used as the impedance circuit 27. Where the maximal point of the magnetic field strength is stably fixed in the center of the sample coil 1, the impedance circuit 27 is not necessary.

The position at which the magnetic field strength maximizes can be easily identified if the total transmission line length $L_n$ is determined. For example, where n=1, the total transmission line length $L_n$ becomes equal to $\lambda$. Therefore, the magnetic field strength is maximized at a point spaced from the junction between the resonant circuit 30 and the impedance circuit 27 by a distance of $(1/2)\lambda$. If the integer n is two or more, the magnetic field strength has plural maximal points in the resonant circuit 30. Accordingly, the number of locations where the sample coil 1 can be placed is increased.

In order that the maximal point of the magnetic field strength in the resonant circuit 30 satisfying Eq. (4) be placed in the center of the sample coil 1, the total transmission line length $L_n$ is first determined. The position on the circuit at which the magnetic field strength maximizes, i.e., the center position of the coil 1, is determined. Then, the transmission line length $L_s$ of the coil 1 of the circuit is determined. Thereafter, the transmission line length of the first line 6 and the transmission line length of the second line 7 are calculated so as to satisfy Eq. (4). Both lines 6 and 7 are connected with the opposite ends of the sample coil 1. The lines 6 and 7 are connected together. The impedance circuit 27 is connected between the first line 6 or second line 7 and ground.

If the resonant circuit 30 is designed in this way, an intense magnetic field can be produced in the sample coil 1 in NMR measurements, and the magnetic field emanating from the sample can be detected with high sensitivity.

The description of the resonant circuit 30 described above is based on the assumption that the sample coil 1, first transmission line 6, and second transmission line 7 are directly connected. Coupling circuits or impedance circuits via which those components are connected may also be provided.

Figure 22:
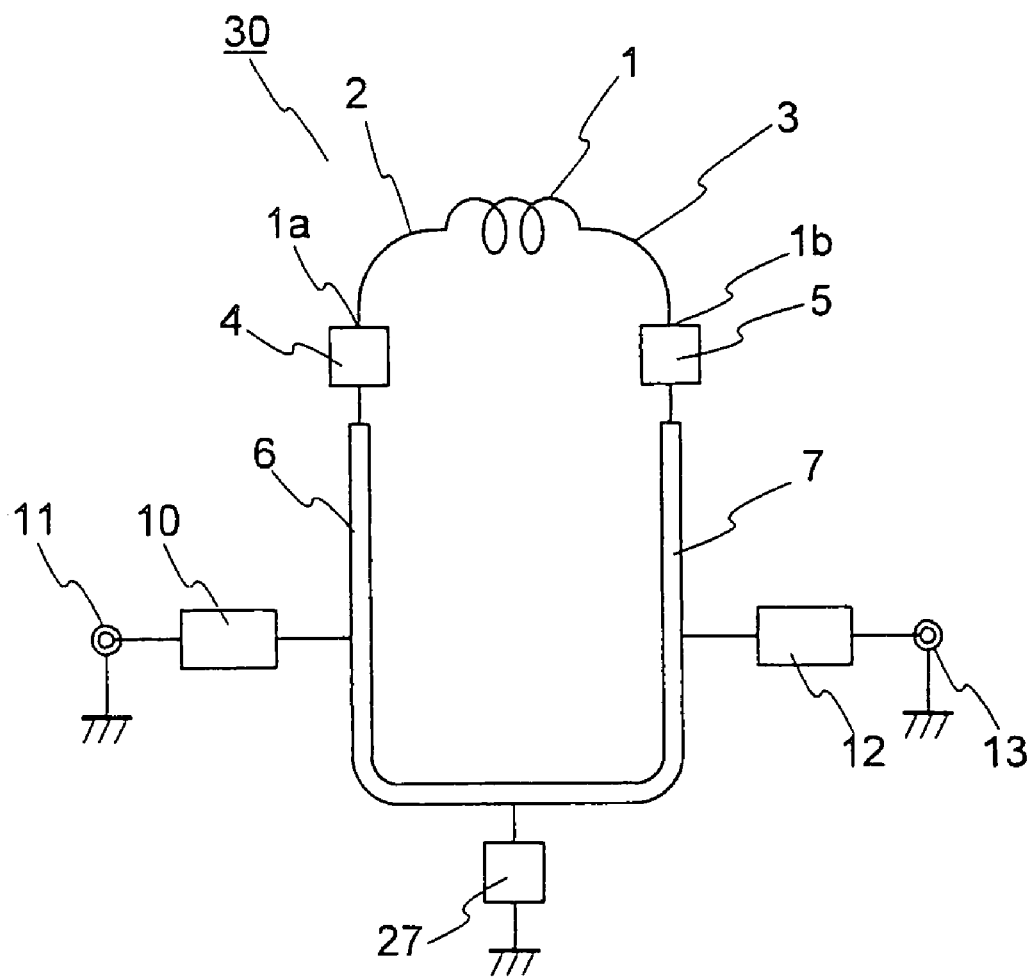
FIG. 22 is a diagram similar to FIG. 20, but in which coupling circuits, impedance circuits, and a matching circuit are added.

FIG. 22 is a diagram of the NMR probe according to the present embodiment, and in which coupling circuits and impedance circuits are added. As shown in FIG. 22, a first coupling circuit 4 is connected between the first end 1a of the sample coil 1 and the first transmission line 6 to couple them. A second coupling circuit 5 is connected between the second end 1b of the coil 1 and the second transmission line 7 to couple them. The impedance circuit 27 is connected between the first line 6 or second line 7 and ground.

Each of the first and second coupling circuits 4 and 5, respectively, includes a variable impedance element for tuning the resonant circuit 30 to the first RF frequency $f_1$, second RF frequency $f_2$, or third RF frequency $f_3$. $F_2$ and $F_3$ will be described later. Furthermore, each of the coupling circuits 4 and 5 includes a connector for connection of the sample coil 1. The first and second coupling circuits 4 and 5 may all be added. Alternatively, any one of them may be added.

Where the first and second coupling circuits 4, 5 are added to the resonant circuit 30, the transmission line length $L_s$ of the conductor of the sample coil 1, the transmission line length $L_a$ of the first line, and the transmission line length $L_b$ of the second line are appropriately corrected taking account of the impedances of the coupling circuits 4 and 5. The total transmission line length $L_n$ is made to comply with Eq. (4).

Because the resonant circuit 30 has the total transmission line length $L_n$ complying with Eq. (4), the resonant circuit resonates at the first RF frequency $f_1$. Accordingly, an intense magnetic field is set up in the sample coil 1 in NMR measurements. The magnetic field produced from the sample can be detected with good sensitivity.

The NMR probe according to the present embodiment may have a connector 13 from which the second RF waves having the frequency $f_2$ are applied and a second matching circuit 12 for entering the second RF waves into the resonant circuit 30. These are indicated by the broken lines in FIG. 20. The frequency $f_2$ of the second RF waves used in general NMR measurements is a fraction of the frequency $f_1$ of the first RF waves and does not affect the configuration of the resonant circuit 30 complying with Eq. (4). Therefore, it is possible to apply the second RF waves of $f_2$ to the resonant circuit 30 while it is resonating with the first RF waves of $f_1$. The first and second RF waves can be superimposed in the resonant circuit 30. The second matching circuit 12 is connected with the resonant circuit 30 by the same method as used to connect the first matching circuit 10.

Figure 24:
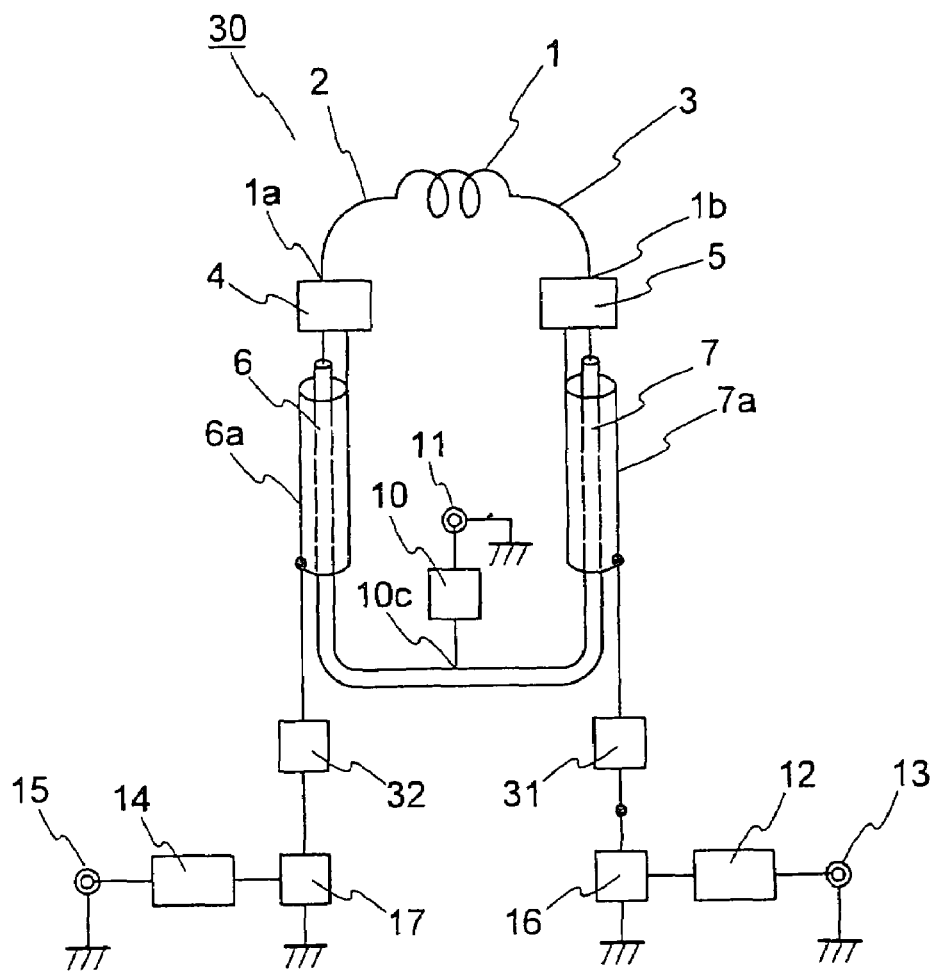
FIG. 24 is a diagram similar to FIG. 20, but in which coaxial cables are used.

In the NMR probe according to the present embodiment, each of the first transmission line 6 and second transmission line 7 may be made of a coaxial cable having an outer conductor layer. FIG. 24 is a diagram of the resonant circuit in which each of the transmission lines 6 and 7 is made of a coaxial cable. The inner conductors of the coaxial cables correspond to the first transmission line 6 and the second transmission line 7, respectively. One end of the first line 6 is connected with a first end 1a of the coil 1 via the first coupling circuit 4. One end of the second line 7 is connected with a second end 1b of the coil via the second coupling circuit 5. The other ends of the first line 6 and second line 7 are connected together. As a result, the resonant circuit 30 forming a ring circuit is built.

The resonant circuit 30 further includes the first matching circuit 10 and a first connector 11 connected with the first matching circuit 10. The first matching circuit 10 permits the first RF waves having the frequency $f_1$ to be passed into or from the junction 10c between the first line 6 and the second line 7 or into or from a part close to the junction. The first matching circuit 10 performs impedance transform to match the resonant circuit 30 and first connector 11.

The resonant circuit 30 and first matching circuit 10 are magnetically coupled using a magnetic coupling coil 62 as shown in FIG. 23. Another method of connection is that the electric currents flowing on both sides of the magnetic coupling coil 62 are directed in the same direction near the coil 62 in the resonant circuit 30 as described previously.

In the coaxial cable, one end of the outer conductor layer 6a is connected with the impedance circuit 16 via an RF element circuit 31 that blocks passage of the first RF waves of the frequency $f_1$. One end of the outer conductor layer 7a is connected with the impedance circuit 17 via an RF element circuit 32 that blocks passage of the first RF waves having the frequency $f_1$.

The second RF waves having the frequency $f_2$ are coupled to the impedance circuit 16 via the second connector 13 and second matching circuit 12. Where the second RF waves are entered from the second connector 13, the second RF waves pass through the RF element circuit 31 via these components and reach the outer conductor layer 7a.

The third RF waves having the frequency $f_3$ are coupled to the impedance circuit 17 via the third connector 15 and third matching circuit 14. Where the third RF waves of $f_3$ are entered from the third connector 15, the third RF waves pass through the RF element circuit 32 via these components and reach the outer conductor layer 6a.

The second matching circuit 12 and impedance circuit 16 are matched such that the second connector 15 shows an impedance of 50 ohm for the second RF waves of $f_2$. The third matching circuit 14 and impedance circuit 17 are matched such that the third connector 15 shows an impedance of 50 ohm for the third RF waves of $f_3$.

The first coupling circuit 4 and second coupling circuit 5 pass the second RF waves of $f_2$ and third RF waves of $f_3$, respectively, to the outer conductor layer 7a.

Each of the outer conductor layers 6a and 7a usually assumes a seamless geometry. The outer conductor layers 6a and 7a may have holes or a slit. Examples of the structure of these outer conductor layers are shown in FIGS. 7 and 8.

Also, in the above structure, the transmission line length $L_s$ of the conductor of the sample coil 1, the transmission line length $L_a$ of the first line, and the transmission line length $L_b$ of the second line are appropriately corrected taking account of the impedances of the first and second coupling circuits 4 and 5, respectively, and the cross-sectional structure of the lines made discontinuous. The total transmission line length $L_n$ is made to comply with Eq. (4).

Since the resonant circuit 30 has a total transmission line length $L_n$ complying with Eq. (4), the resonant circuit resonates with the first RF waves having the frequency $f_1$. Consequently, a strong magnetic field can be produced within the sample coil 1 in NMR measurements, and the magnetic field emitted from the sample can be detected with good sensitivity.

In the examples described so far, no restrictions are imposed on the whole shape of the sample coil 1 or on the geometry or material of the conductors as long as the transmission line length $L_s$ can be found. The shape of the winding of the sample coil 1 can be circular or elliptical. Besides, as shown in FIG. 9, (a)-(c), the cross section of the coil may be polygonal such as square. Moreover, a saddle-shaped coil, Helmholtz coil, or scroll coil may also be used.

As described so far, according to the NMR probe according to the present invention, when RF waves are applied, a magnetic field whose strength maximizes in the center of the sample coil can be produced. Therefore, a magnetic field adapted for the sample can be set up. Furthermore, high-sensitivity NMR measurements are enabled.

What is claimed is:
1. An NMR probe comprising:
   a resonant circuit resonating with first RF waves, the resonant circuit including a sample coil having a first and a second ends, a first transmission line having a first end and a second end grounded, and a second transmission line having a first end and a second end grounded, the sample coil being made of a conductor, the first end of the first transmission line being connected with the first end of the sample coil, the first end of the second transmission line being connected with the second end of the sample coil;

a first connector for entering and extracting the first RF waves; and a first matching circuit connected between the first connector and the resonant circuit;

wherein the total transmission line length of the conductor of the sample coil, the first transmission line, and the second transmission line is set to a value at which standing waves given by $$\lambda+(n-1)\times\lambda/2$$

are produced, where $\lambda$ is the wavelength of the first RF waves applied to the resonant circuit and n is a positive integer; and wherein the sample coil is placed at a position where the strength of a produced magnetic field is maximized.

2. An NMR probe comprising:

a resonant circuit resonating with first RF waves, the resonant circuit including a sample coil having a first and a second ends, a first transmission line having a first end and a second end grounded, and a second transmission line having a first end and a second end electrically opened, the sample coil being made of a conductor, the first end of the first transmission line being connected with the first end of the sample coil, the first end of the second transmission line being connected with the second end of the sample coil;

a first connector for entering and extracting the first RF waves; and a first matching circuit connected between the first connector and the resonant circuit;

wherein the total transmission line length of the conductor of the sample coil, the first transmission line, and the second transmission line is set to a value at which standing waves given by $$(3/4)\lambda+(n-1)\times\lambda/2$$

are produced, where $\lambda$ is the wavelength of the first RF waves applied to the resonant circuit and n is a positive integer; and wherein the sample coil is placed at a position where the strength of a produced magnetic field is maximized.

3. An NMR probe comprising:

a resonant circuit resonating with first RF waves, the resonant circuit including a sample coil having a first and a second ends, a first transmission line having a first end and a second end electrically opened, and a second transmission line having a first end and a second end electrically opened, the sample coil being made of a conductor, the first end of the first transmission line being connected with the first end of the sample coil, the first end of the second transmission line being connected with the second end of the sample coil;

a first connector for entering and extracting the first RF waves; and a first matching circuit connected between the first connector and the resonant circuit;

wherein the total transmission line length of the conductor of the sample coil, the first transmission line, and the second transmission line is set to a value at which standing waves given by $(n/2)\lambda$ are produced, where $\lambda$ is the wavelength of the first RF waves applied to the resonant circuit and n is a positive integer; and wherein the sample coil is placed at a position where the strength of a produced magnetic field is maximized.

4. An NMR probe comprising:

a resonant circuit resonating with first RF waves, the resonant circuit including a sample coil having a first and a second ends, a first transmission line having a first end connected with the first end of the sample coil, and a second transmission line having a first end connected with the second end of the sample coil, the sample coil being made of a conductor, second ends of the first and second transmission lines being connected together;

a first connector for entering and extracting the first RF waves; and a first matching circuit connected between the first connector and the resonant circuit;

wherein the total transmission line length of the conductor of the sample coil, the first transmission line, and the second transmission line is set to a value at which standing waves given by $n\lambda$ are produced, where $\lambda$ is the wavelength of the first RF waves applied to the resonant circuit and n is a positive integer; and wherein the sample coil is placed at a position where the strength of a produced magnetic field is maximized.

5. An NMR probe as set forth in any one of claims 1, 2, and 4, further including a first impedance circuit, and wherein said second end of said first transmission line is grounded via the first impedance circuit.

6. An NMR probe as set forth in claim 5, further including a second impedance circuit, and wherein said second end of said second transmission line is grounded via the second impedance circuit.

7. An NMR probe as set forth in any one of claims 1 to 4, further including a first and a second coupling circuits, wherein said first coupling circuit couples said first end of the sample coil to said first end of the first transmission line and said second coupling circuit couples said second end of the sample coil to said first end of the second transmission line.

8. An NMR probe as set forth in any one of claims 1 to 4, wherein at least one of said first and second transmission lines includes reactance elements.

9. An NMR probe as set forth in any one of claims 1 to 4, further including a second connector for entering and extracting second RF waves and a second matching circuit connected between the second connector and said resonant circuit.

10. An NMR probe as set forth in any one of claims 1 to 4, further including a third connector for entering and extracting third RF waves and a third matching circuit connected between the third connector and said resonant circuit.

11. An NMR probe as set forth in any one of claims 1 to 4, wherein at least one of said first and second transmission lines is a coaxial cable having an outer conductor layer.

12. An NMR probe as set forth in any one of claims 1 to 4, wherein there is provided a coaxial cable having an inner conductor and an outer conductor layer, and wherein one of said first and second transmission lines is said inner conductor, while the other is said outer conductor layer.

* * * * *

UNITED STATES PATENT AND TRADEMARK OFFICE
CERTIFICATE OF CORRECTION

PATENT NO.        : 7,456,631 B1                                        Page 1 of 1
APPLICATION NO.   : 11/841318
DATED             : November 25, 2008
INVENTOR(S)       : Shino It is certified that error appears in the above-identified patent and that said Letters Patent is hereby corrected as shown below:

Column 21, Line 17, Claim 1, "where % is" should read -- where $\lambda$ is --

Signed and Sealed this

Seventh Day of April, 2009

JOHN DOLL
*Acting Director of the United States Patent and Trademark Office*